US009178352B2

(12) United States Patent
Butler

(10) Patent No.: US 9,178,352 B2
(45) Date of Patent: Nov. 3, 2015

(54) PERFORMANCE AND ISOLATION IMPROVEMENTS FOR DIGITALLY CONTROLLED AC ATTENUATION AND PROTECTION CIRCUITS

(71) Applicant: Butler Engineering LLC, Springfield, MO (US)

(72) Inventor: Joel Butler, Springfield, MO (US)

(73) Assignee: Butler Engineering LLC, Springfield, MO (US)

( * ) Notice: Subject to any disclaimer, the term of this patent is extended or adjusted under 35 U.S.C. 154(b) by 0 days.

(21) Appl. No.: 14/518,679

(22) Filed: Oct. 20, 2014

(65) Prior Publication Data

US 2015/0035363 A1    Feb. 5, 2015

Related U.S. Application Data

(63) Continuation of application No. 13/670,848, filed on Nov. 7, 2012, now Pat. No. 8,873,211.

(60) Provisional application No. 61/557,518, filed on Nov. 9, 2011.

(51) Int. Cl.

| H02H 3/00 | (2006.01) |
|---|---|
| H02H 9/04 | (2006.01) |
| G05F 1/10 | (2006.01) |
| H02H 9/02 | (2006.01) |
| H03K 17/795 | (2006.01) |
| H02J 7/14 | (2006.01) |
| H02J 3/00 | (2006.01) |

(52) U.S. Cl.
CPC .. *H02H 9/04* (2013.01); *G05F 1/10* (2013.01); *H02H 9/025* (2013.01); *H03K 17/795* (2013.01); *H02J 3/00* (2013.01); *H02J 7/1415* (2013.01); *H03K 2217/0054* (2013.01); *Y10T 307/406* (2015.04)

(58) Field of Classification Search
USPC .............................................. 361/86, 87, 91.1
See application file for complete search history.

(56) References Cited

U.S. PATENT DOCUMENTS

| 2009/0206818 A1* | 8/2009 | Horan | H02M 5/257 323/311 |
|---|---|---|---|
| 2012/0229191 A1* | 9/2012 | Galm | H03K 17/735 327/427 |

* cited by examiner

*Primary Examiner* — Danny Nguyen
(74) *Attorney, Agent, or Firm* — Bell Nunnally & Martin LLP; Craig J. Cox

(57) ABSTRACT

A protection and attenuation circuit for sensitive AC loads is described. The circuit provides AC power protection and attenuation utilizing high-efficiency switch-mode techniques to attenuate an AC power signal by incorporating a bidirectional, transistorized switch driven from a pulse width modulation signal, PWM. The circuit monitors characteristics of the AC power signal driving a known load and characteristics of the load or other elements and determines the duty cycle of the pulse width modulated signal, PWM, based upon the duration and amplitude of the over-voltage, over-current, over-limit or other event.

20 Claims, 19 Drawing Sheets

PERFORMANCE AND ISOLATION IMPROVEMENTS FOR DIGITALLY CONTROLLED AC ATTENUATION AND PROTECTION CIRCUITS

CROSS REFERENCE TO RELATED INFORMATION

This application is a continuation of U.S. patent application Ser. No. 13/670,848, filed Nov. 7, 2012; which claims the benefit of U.S. Provisional Patent Application No. 61/557,518, filed Nov. 9, 2011, the contents of which are hereby incorporated herein in its entirety.

TECHNICAL FIELD

This invention relates to electronic circuits and more particularly circuits to protect AC load from excessive power.

BACKGROUND OF THE INVENTION

As described in US Patent Application No. 2011/0090604, it is desirable to protect an AC load from excessive power through the use digitally controlled bidirectional switching. In such topologies, the AC input voltage ACIN, optional feedback signals FBAK, and optional current monitoring signals IMON are continuously monitored by a system controller that is operable to process the monitored signals and look for overage conditions. Upon such overage conditions, the system controller is typically implemented to generate one or more Pulse Width Modulated PWM signals proportionate to the amount of desired AC power reduction. The said PWM signals are then transmitted to one or more bidirectional switches arranged in a configuration that provide series AC switching and parallel AC switching. Typically the bidirectional switches connected in series with the AC input ACIN and the load are implemented with a bypass path that allows AC current flow prior to detecting the AC overage condition, wherein the said bypass path is many times implemented with a normally closed electromechanical relay, or a normally conductive MOSFET device such as a depletion MOSFET. Unfortunately, depletion MOSFET devices are relatively high priced and generally require higher power enhancement mode devices in parallel to provide a less expensive conductive path for the AC current flow. Electromechanical relays do provide a less expensive solution versus depletion MOSFETS, but degrade the product lifecycle and exhibit a relatively slow response time when actuating, 3 to 5 msec, wherein a sensitive AC load may be damaged as a result of slow response time.

Considering the AC voltage monitoring techniques, typically the AC input voltage ACIN or AC output voltage ACOUT are directly connected and monitored by the system control stage. In these topologies the system control stage may not be electrically floating with respect to the AC input signal ACIN or the AC output signals being fed back FBAK. As a result of not providing electrical isolation for the system control stage, outside communication with the system control stage, such as USB or other digital communication schemes, typically require high-speed digital isolators and using one system control stage to monitor and control multiple channels of AC bidirectional switching becomes problematic. In other words, multi-channel systems with a plurality of AC inputs ACINS would typically require multiple system controllers, wherein each AC input signal ACIN would be monitored by its own system control stage. Such a topology would not be ideal for multi-channel AC attenuation and protection devices due to increased system cost and complicated communication schemes between adjacent AC channels. Additionally, in systems utilizing current monitoring for determination of load power or load impedance, math intensive computations are needed which typically require a system controller with suitable multiplication capability.

Considering the powering options, applications have generally incorporated a high efficiency power supply operable to derive necessary power for all operational stages, including the system control stage, signal conditioning stage, isolation stage, and bidirectional switching stages, from the inbound AC input signal ACIN. In the past, this ACIN power supply stage has been required to turn on or enable well before the detection of overages. As mentioned earlier, designs incorporating depletion MOSFET devices for use as an AC bypass path have required the power supply to turn on prior to an overage condition in order to activate the gate drive on higher power enhancement mode MOSFET devices connected in parallel with the depletion devices. As a result, the enhancement mode MOSFET devices enable prior to the detection of overage conditions, and due to their significantly reduced ON resistance, the enhancement mode MOSFETs relieve the depletion MOSFET devices from any significant electrical current flow. This topology has been demonstrated to work very well; however, enabling the power supply that is fed from the AC input signal ACIN can result in measurable harmonic distortion on the inbound AC line, thereby increasing the harmonic distortion at the load.

BRIEF SUMMARY OF THE INVENTION

In a preferred embodiment, a protection circuit for AC loads is described. The circuit includes a controller monitoring one or more characteristics of an AC signal on an electrical line in communication with the AC load, wherein the controller is operable to generate a pulse width modulated signal based on the one or more characteristics of the AC signal, and a switching stage connected to the electrical line carrying the AC signal and controlled by the controller, wherein the switching stage attenuates the AC signal using the pulse width modulated signal from the controller. One or more electrical isolation stages are also included where the electrical isolation stages act to isolate the controller from at least the switching stage and a signal conditioning stage that provides a signal indicative of the one or more characteristics of the AC signal, such that the controller is electrically isolated from the AC signal and electrically floats relative to the AC signal.

In another preferred embodiment, a protection circuit for multiple AC loads is described. The circuit includes a controller that monitors one or more characteristics of each of a plurality of AC signals, each of the AC signals on an electrical line in communication with an associated AC load. The controller is operable to generate a pulse width modulated signal for each of the AC signals based on the one or more characteristics of the plurality of AC signals. A plurality of signal conditioning stages are connected to the controller provides a signal indicative of the monitored characteristics of the associated AC signal. A plurality of switching stages are connected to the electrical line carrying the associated AC signal and are controlled by the controller, where each of the switching stages attenuates the associated AC signal using the pulse width modulated signal from the controller. One or more electrical isolation stages are operable to isolate the controller from at least the plurality of switching stages and the plurality of signal conditioning stages, such that the controller is electrically isolated from the plurality of AC signals and electrically floats relative to the plurality of AC signals.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which.

DETAILED DESCRIPTION OF THE INVENTION

Embodiments of the present invention provide protection for an AC load from excessive power while broadly offering the following additional capabilities: (1) complete electrical isolation for the system control stage from the high voltage AC input signal ACIN and feedback signals FBAK; (2) a low-cost technique for passing isolated voltage monitoring signals and current monitoring signals to the electrically floating system control stage; (3) a high resolution technique for passing isolated voltage monitoring signals and current monitoring signals to the electrically floating system control stage; (4) a simple technique for combining the high resolution isolated voltage monitoring signals and current monitoring signals to derive therefrom real-time power and or impedance measurements without the use of complicated multipliers; (5) a multi-channel solution that provides full AC signal monitoring and load monitoring through a single system control stage and a plurality of AC bidirectional switching stages; (6) a technique for reducing cost and reducing power supply stage harmonic distortion through the use of an electrically charged device such as a battery or super capacitor; and (7) an optional embodiment providing the ability to directly connect the system control stage and monitoring stage to the series bidirectional switch.

Through application of the concepts described herein, embodiments of a high performance AC attenuation and protection circuit can be constructed with multiple channels of AC protection, real-time high resolution power measurement, reduced cost, and reduced distortion. These benefits make the present invention ideal for use in stand-alone AC attenuation and protection applications wherein the invention is used outside of a fixed load environment, such as for use within chassis mounted multi-channel loudspeaker protection devices for consumer home audio applications or professional audio applications.

Figure 1:
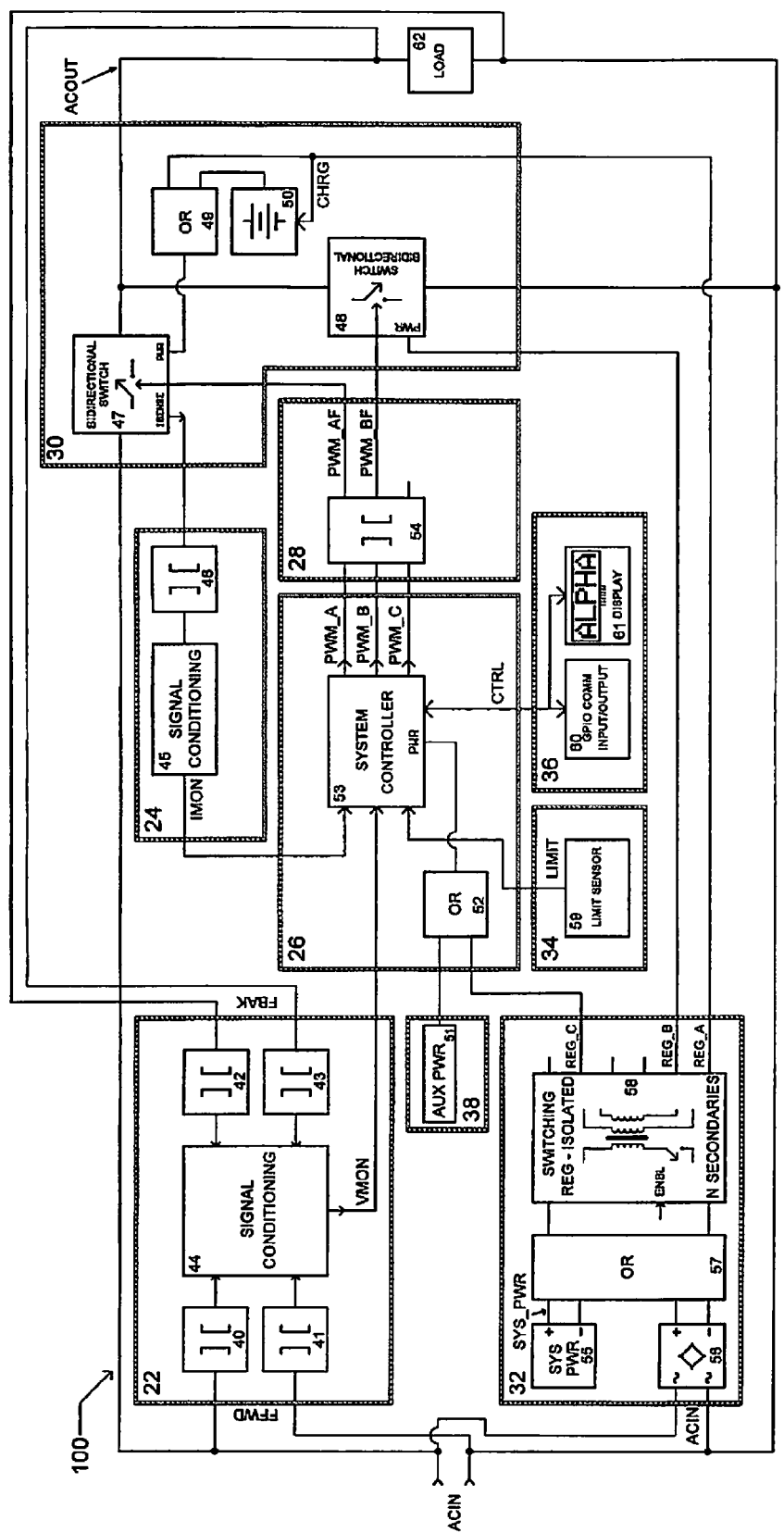
FIG. 1 is a block diagram of a first preferred embodiment of the present invention.

Referring now to FIG. 1, a preferred embodiment of a AC load protection circuit incorporating one or more of the described advantages is shown, As described, the embodiment of the AC load protection circuit shown in FIG. 1 provides high performance AC protection and attenuation utilizing high-efficiency switch-mode techniques to attenuate an AC signal by incorporating one or more bidirectional, transistorized switches driven from one or more pulse width modulated signals, PWM, and further provides means to: (1) electrically isolate voltage and current monitoring signals, (2) lower the system cost, and (3) improve AC signal fidelity. Embodiments of the circuits described herein provide electrically isolated monitoring characteristics of an AC signal or load and determines the duty cycle of the pulse width modulated signal, PWM, based upon the duration and amplitude of the harmful event.

A preferred method of deriving the pulse width modulation signal, PWM, is to use a microcontroller device with an onboard analog to digital converter, ADC, for monitoring the electrically isolated AC signal characteristics. However, it should be noted that derivation of the pulse width modulated signal, PWM, could be done through a variety of techniques common to the art of power management, such as a hysteretic control, triangle or saw intercept, or sigma-delta modulation. By utilizing electrically isolating techniques, the present invention allows the system microcontroller to electrically float with respect to the inbound AC signals, which allows a single system microcontroller to monitor multiple AC protection and attenuation channels and greatly simplifies the interface between the system microcontroller and any other external digital devices that may be earth ground referenced. Additionally, by eliminating the requirement for high cost depletion mode MOSFET devices and reducing the power consumption requirements on the inbound AC signal, the present invention provides a means to reduce the system cost and greatly improve AC signal fidelity by harmonic distortion reduction. Concerning signal fidelity, the present invention can be implemented to provide significant harmonic distortion improvements over previous AC protection and attenuation techniques.

Embodiments of AC power protection circuitry according to the concepts described herein broadly include an isolated power supply stage, an isolating voltage monitor stage, an isolating current monitor stage, a system control stage, a pulse isolation stage, and a bidirectional switching stage with optional enhancement MOSFET hold-up capability. Several optional stages can be incorporated to create subsequent embodiments that will be presented in the detailed description.

The high performance AC protection and attenuation circuit 100 is shown constructed in accordance with a first embodiment of the present invention. The protection circuit 100 can include optional isolating current monitor stage 24, isolating voltage monitor stage 22, limit sense stage 34, system auxiliary voltage source 38, interface stage 36, and enhancement MOSFET hold-up circuitry blocks 49 and 50. The system in circuit 100 is drawn to illustrate the option of feed-forward FFWD or feed-back FBAK isolated voltage monitoring configurations. The protection circuit 100 broadly comprises an isolated power supply stage 32, system control stage 26, pulse isolating stage 28, and bidirectional switching stage 30.

The isolating voltage monitor stage 22 is operable to receive one or more voltage signals FFWD, FBAK and derive therefrom one or more isolated voltage monitoring signals VMON for passage to system control stage 26. Isolating voltage monitor stage 22 broadly contains one or more electrical isolating devices 40, 41, 42, 43 and proper signal conditioning circuitry 44. Though not limited thereto, isolating devices 40, 41, 42, 43 can be implemented with a plurality of different techniques such as optical isolators, integrated digital isolators, transformers, etc. Further discussion of this topic will be described in the detailed description of later figures. By using electrical isolators 40, 41, 42, 43, the derived voltage monitor output signal VMON is completely electrically isolated from the inbound AC signal ACIN and the outbound AC signal ACOUT.

The isolating current monitor stage 24 is operable to monitor current flow through the bidirectional switching stage 30 and derive therefrom one or more isolated current monitoring signals IMON for passage to system control stage 26. Isolating current monitor stage 24 broadly contains one or more electrical isolating devices 46 and proper signal conditioning circuitry 45. Though not limited thereto, isolating device 46 can be implemented with a plurality of different techniques such as optical isolators, integrated digital isolators, transformers, etc. Further discussion of this topic will be described in the detailed description of later figures. By using electrical isolator 46, the derived current monitor output signal IMON is completely electrically isolated from the inbound AC signal ACIN and the outbound AC signal ACOUT.

The system control stage 26 is operable to receive one or more input signals such as VMON, IMON, LIMIT, CTRL, and derive therefrom one or more pulse width modulated signals PWM_A, PWM_B, PWM_C. When AC attenuation, protection, or signal modification is required, the duty of these PWM signals is managed by the system control stage as needed. The typical range of PWM duty cycle control ranges from 0% to 100% duty based upon the desired AC attenuation. For example, if no AC attenuation is required and the system controller has not be commanded to implement any AC signal modification, the PWM signal PWM_A controlling the series bidirectional switch 47 will nominally be generated with 100% duty cycle, while PWM_B driving clamping bidirectional switch 48 will by nominally generated with 0% duty. In this manner, the system control stage 26 can permit unobstructed AC current flow to load 62. Conversely, if system control stage 26 desires to reduce the AC output current and voltage, a variable PWM duty can be generated at PWM_A and PWM_B to reduce the AC current and voltage delivered to the load.

It is typical to operate the PWM switching frequency of PWM_A and PWM_B at rates high enough to allow passage of the AC input signal bandwidth. For example, in audio applications PWM_A and PWM_B are generally operated at switching frequencies greater than 40 thousand cycles per second (40 kHz). Also, it should be noted that the present invention does allow provision for system controller 53 to independently generate PWM_A and PWM_B, thereby allowing system controller 53 to implemented digitally controlled dead-time or times wherein PWM_A and PWM_B are simultaneously driven low to eliminate cross-conduction between bidirectional switch 47 and 48.

System control stage 26 is operable to receive power from an auxiliary power source 38 or the main isolated power supply stage 32. In this manner, system control stage 26 is electrically isolated from the AC input ACIN and AC output ACOUT signals, thereby allowing system controller 53 to electrically float with respect to input and output AC signals. This is critical for applications wherein the system controller 53 is interfacing with an external digital device that may be earth ground referenced, such as a personal computer. This type of interfacing is illustrated in interface stage 36 wherein one or more control signals CTRL is connected between system controller 53 and a general purpose input/output port 60 GPIO, or a display interface 61. Though not limited thereto, several common IO ports could be used within the present invention such as Universal Serial Bus USB, Ethernet TCP/IP, Firewire, Wi-Fi IEEE 802.11, Bluetooth, RS-232 or 485. These communication ports can allow system control stage 26 to report AC input, output, and load conditions as desired. Electrically floating system control stage 26 is also a necessity when a signal system controller 53 is used to control multiple bidirectional switching channels which will be discussed in reference to later figures.

System control stage 26 may also be implemented to allow a low power auxiliary voltage source to power system controller 53 during times when the main power supply stage 32 is deactivated. This is illustrated through ORing block 52 within system control stage 26. Providing auxiliary powering solutions enables the present invention to continuously monitor the AC input ACIN and output ACOUT signal characteristics without cycling power on system controller 53 and without continuously enabling and disabling the power supply stage 32. This benefit of the concepts described herein is critical within audio systems wherein it is (1) ideal to minimize the response time of the system controller 53 and (2) reduce the electrical current consumed by power supply stage 32, especially when power supply stage 32 is configured to operate off of the inbound AC signal ACIN via typical AC rectification 56.

Reducing the electrical current consumption of power supply stage 32 when operating from AC input signal ACIN is critical for reducing the harmonic distortion in sensitive audio applications. Typically, when power supply stage 32 is configured to operate from the inbound AC input ACIN, a rectification block 56 is used prior to voltage regulation 58, thereby naturally generating unwanted harmonic content during commutation of rectifier block 56. Even when Power Factor Correcting PFC techniques are used, the measurable harmonic content of power supply stage 32 is not ideal for sensitive audio applications. Therefore, when using circuit 100 to derive operational power from the inbound AC signal ACIN, allowing the power supply stage 32 to remain in its lowest current consumption mode while providing a means for the system controller 53 to remain active via auxiliary source 38, is an especially attractive benefit of the present invention.

Auxiliary power stage 38 is operable to provide system control stage 53 with adequate power to remain in a fully active or low power mode of operation. Auxiliary power block 51 can be implemented with a variety of techniques including but not limited to: (1) a battery, (2) a super capacitor, or (3) a low power regulated DC supply operating an electrically isolated external DC source. The benefits of providing a low-power auxiliary supply for system control stage 26 were presented in the previous sections detailing system control stage 26.

Isolated power supply stage 32 is operable to receive one or more input signals ACIN, SYS_PWR, and derive therefrom one or more electrically isolated voltages such as REG_A, REG_B, REG_C. Isolated power supply stage 32 typically contains an isolating switch-mode voltage regulation block 58 and an appropriate input network consisting of optional input rectifier 56, optional system power input 55, and a simple ORing block 57. The primary objective of isolated power supply stage 32 is to create independent, electrically isolated voltage potentials for passage to the series bidirectional switches 47, the clamping bidirectional switches 48, and if so configured, the isolating voltage monitoring stage 22, the isolating current monitor stage 24, and system control stage 26. Electrical isolation is critical for the present invention to allow proper floating of the bidirectional switches, the monitoring circuits, and the system control stage. Benefits of said electrical isolation have been previously discussed but can be summarized by (1) simplifying the interfacing of system controller 53 and outside devices through interface port 60, and (2) allowing a single system controller to communicate and monitor multiple bidirectional switching channels, as will be discussed later.

Bidirectional switching stage 30 is operable to receive one or more electrically floating PWM signals PWM_AF, PWM_BF, as well as one or more electrically floating power signals REG_A, REG_B. Circuit 100 illustrates a bidirectional switching stage 30 constructed with a series bidirectional switch 47, a load clamping bidirectional switch 48, an electrically charged device 50, and an ORing block 49. Unique to the present invention is the addition of electrically charged device 50 and ORing block 49, which provides gate voltage to enhancement mode MOSFET devices allowing them to be used as "normally-on" devices without the presence of powering signals REG_A and REG_B. This novel implementation provides several key advantages over previous techniques: (1) allows the removal of costly depletion MOSFET devices within bidirectional switch 47, (2) allows isolated power supply stage 32 to remain disabled or OFF during times when no AC attenuation or protection is required, (3) greatly reduces the induced line harmonics on ACIN and ACOUT by ensuring suitable MOSFET gate potential with or without the presence of input power or AC input ACIN.

These benefits provide the present invention with cost advantages and performance advantages in sensitive applications such as audio systems. Bidirectional switching stage 30 implements the aforementioned advantages by broadly employing an electrically charged device 50 to provide suitable gate voltage to series bidirectional switch 47 during times when power signal REG_A is not available or not needed. Though not limited thereto, electrically charged device 50 can be implemented with a small battery or a super capacitor device, and can be charged as required by charge path CHRG when REG_A is available. In the case of a battery device for block 50, some chemistries permit re-charging, while other battery chemistries do not. The present invention is not limited to re-chargeable devices.

Circuit 100 also illustrates a pulse isolation stage 28, wherein said stage 28 is operable to receive one or more pulse width modulated signals PWM_A, PWM_B, PWM_C and derives therefrom electrically isolated pulse width modulated signals PWM_AF, PWM_BF, PWM_CF. Electrically isolating the system control stage 26 from the bidirectional switching stage 30 allows system controller 53 and bidirectional switches 47 and 48 to float with respect to one another.

Figure 1A:
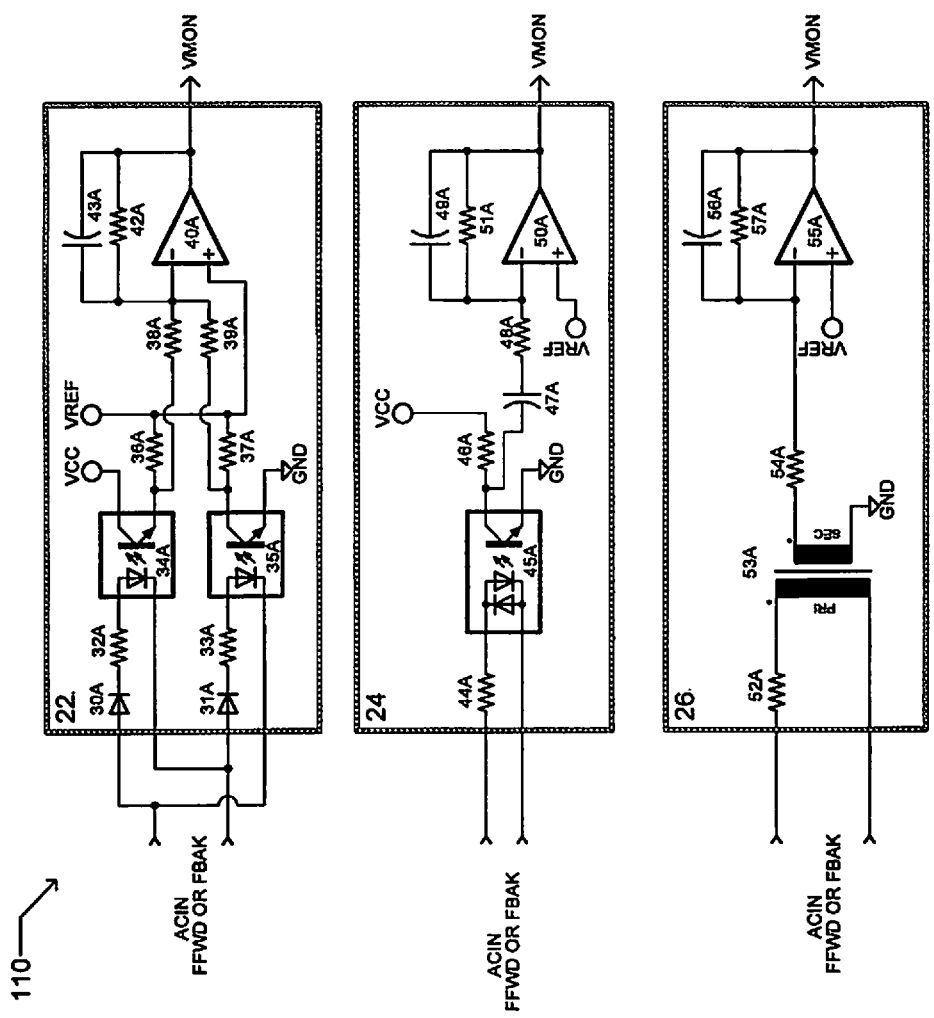
FIG. 1A is a detailed diagram of embodiments of low-cost voltage isolation techniques from FIG. 1.

Referring now to FIG. 1A, a detailed diagram 110 is provided illustrating embodiments of three low cost circuit techniques for implementing the isolating voltage monitor stage 22 as seen in FIG. 1. Though not limited thereto, the circuits contained in FIG. 1A, detailed diagram 110, provide the preferred low cost techniques for deriving an electrically isolated voltage monitoring signal VMON when provided either a feed forward FFWD signal or a feedback signal FBAK. Looking first at optional isolating voltage monitor circuit 22A, this topology provides low cost, electrically isolated AC voltage monitoring through the broad use of linear optical isolators 34A and 35A in conjunction with a signal combining and conditioning operational amplifier circuit 40A. The AC input voltage to circuit 22A is divided into positive and negative polarity by using rectifiers 30A and 31A. Voltage and current biasing for optical isolators 34A and 35A can be achieved through one ore more resistive elements such as 32A or 33A. The output of said linear optical isolators 34A and 35A are biased to the supply voltages typically powering the system control stage 26 of FIG. 1 circuit 100. In FIG. 1A, detailed diagram 110, circuit 22A these system controller referenced potentials are labeled VCC and VREF. Such voltages are commonly used for system microcontrollers and their associated analog to digital converters. Circuit components 38A, 39A, 42A, 43A, and 40A serve to re-combine the isolated positive and negative swinging AC voltage monitoring outputs from linear optical isolators 34A and 35A, while also providing a controlled amount of voltage gain and signal filtration prior to passing VMON to the system control stage (26 of FIG. 1, circuit 100). Providing correct DC biasing at VREF, as well as adequate gain and signal filtration simplify the process of converting the voltage monitor output signal VMON into a digital signal via an analog to digital converter.

Referring again to FIG. 1A, detailed diagram 110 also illustrates an embodiment of a second optional technique for implementing the isolating voltage monitor stage 22 of FIG. 1, circuit 100. Specifically looking at circuit 24A of detailed diagram 110, a bidirectional linear optical isolator 45A is used to capture both positive and negative swings within the input signal ACIN, FFWD, or FBAK. Similarly, operational amplifier circuit 50A and its respective components 49A, 51A, 48A, and 47A serve to condition the output of linear optical isolator 45A in final derivation of voltage monitoring output signal VMON.

Referring again to FIG. 1A, detailed diagram 110 also illustrates an embodiment of a third optional technique for implementing the isolating voltage monitor stage 22 of FIG. 1, circuit 100. Specifically looking at circuit 26A of detailed diagram 110, a low-voltage transformer 53A is used as the primary isolating device, and again the output of said transformer 53A is conditioned and biased by operational amplifier circuit 55A to generate voltage monitoring output signal VMON.

Considering the possible techniques of implementing an isolated current monitoring circuit, the present invention discloses several options in the subsequent detailed descriptions of FIGS. 1B, 1C, 1D, and 1E. It should be noted that these detailed techniques as illustrated in circuits 120, 130, 140, and 150 could be implemented within any of the bidirectional switches, including but not limited to, the series bidirectional switch 47 of FIG. 1, circuit 100; the clamping bidirectional switch 48 of FIG. 1, circuit 100; the neutral leg bidirectional switch 256 of FIG. 1, circuit 200; or any other bidirectional switches incorporated for series or active clamping within the invention. This would also include any optional clamping switches used for AC input clamping in the case of a highly inductive driving element prior to ACIN in FIG. 1, circuit 100.

Figure 1B:
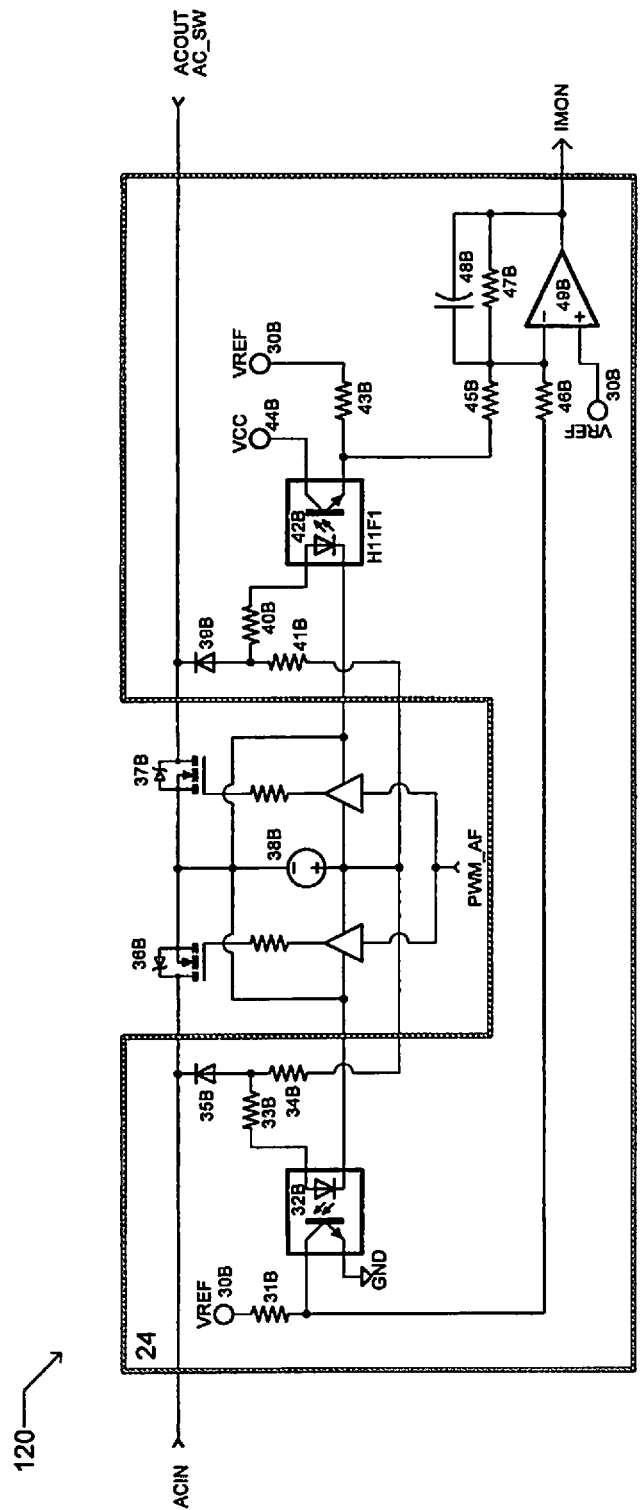
FIG. 1B is a first detailed diagram of an embodiment of a low cost current measurement isolation technique from FIG. 1.

Referring now to FIG. 1B, a detailed diagram 120 illustrates an embodiment of a first optional low cost technique for implementing the isolating current monitor stage 24 of FIG. 1, circuit 100. Though not limited thereto, the circuit contained in FIG. 1B, detailed diagram 120, provides a mechanism to monitor the electrical current flow through a bidirectional switch comprised of transistor devices 36B and 37B and derive therefrom an isolated current monitor output signal IMON for passage to the system control stage (stage 26 in FIG. 1). By sensing the voltage drop across transistors 36B and 37B, the circuit of 24B, detailed diagram 120, can derive a current monitoring signal IMON that directly corresponds proportionally to the electrical current flowing in transistors 36B and 37B. In this configuration the present invention thereby does not require the use of any external lumped current sensing resistive elements as is common to other current sensing techniques.

Similar to the previously discussed low cost isolating voltage monitor techniques, the circuit of 24B splits the monitoring of positive and negative AC current swing into two isolated elements. Linear optical isolator 32B input light emitting diode is fed with the voltage drop across transistor 36B and biased with resistor 34B and 33B. Diode 35B is optional as a blocking device when the polarity swings positive and negative with respect to the common source connection of transistors 36B and 37B. Similarly, linear optical isolator 42B input light emitting diode is fed with the voltage drop across transistor 37B and biased with resistor 40B and 41B. The output of the low cost linear optical isolators 32B and 42B are combined through operational amplifier circuit 49B and its respective biasing components 45B, 46B, 47B, and 48B, thereby providing a controlled amount of voltage gain and signal filtration prior to passing IMON to the system control stage (26 of FIG. 1, circuit 100). Providing correct DC biasing at VREF, as well as adequate gain and signal filtration simplify the process of converting the current monitor output signal IMON into a digital signal via an analog to digital converter.

Figure 1C:
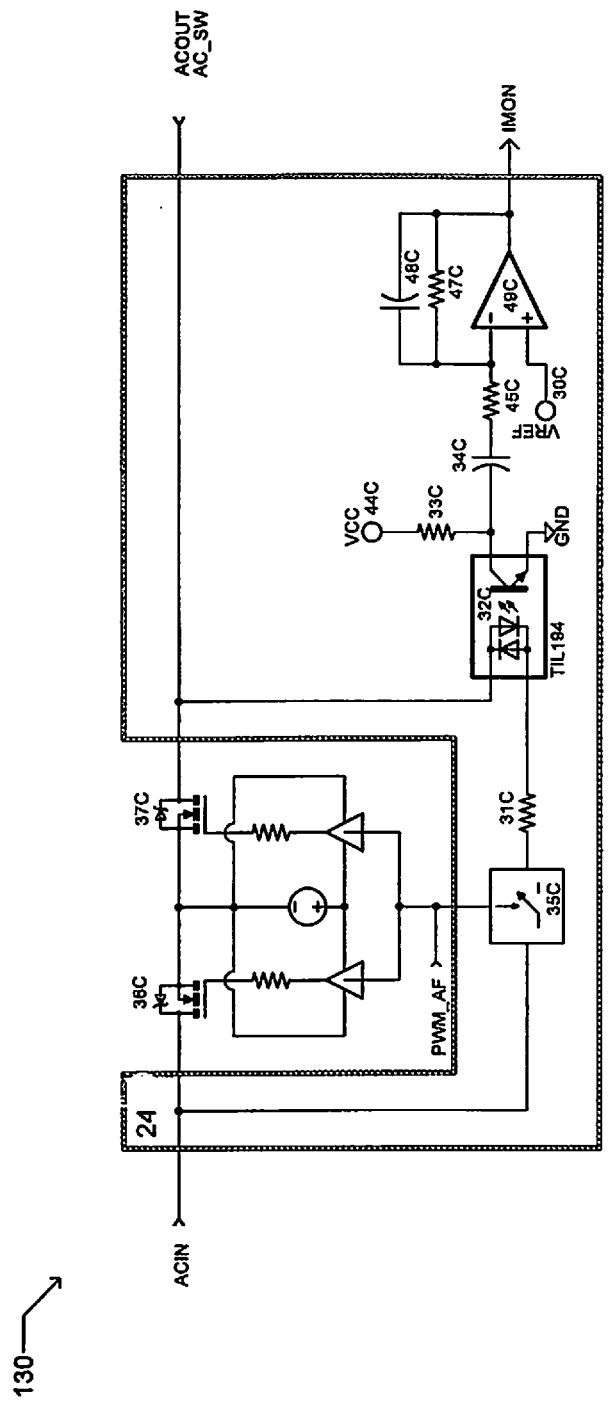
FIG. 1C is a second detailed diagram of an embodiment of a low cost current measurement isolation technique from FIG. 1.

Referring now to FIG. 1C, a detailed diagram 130 illustrates an embodiment of a second optional low cost technique for implementing the isolating current monitor stage 24 of FIG. 1, circuit 100. Though not limited thereto, circuit 24C contains a single bidirectional linear optical isolator 32C to sense the voltage drop across transistors 36C and 37C. Optional blanking control circuit 35C can be employed to open the sense connection to transistors 36C and 37C during times when the transistors are not enabled or during switching transitions. Blanking control circuit 35C is typically controlled by the timing of PWM gate drive signals PWM_AF. Blanking techniques such as those illustrated in circuit 24C could also be implemented within the other isolated current monitor detailed figures FIGS. 1B, 1D, and 1E. Continuing with circuit 24C of FIG. 1C, operational amplifier circuit 49C and its respective biasing components 34C, 45B, 47B, and 48B serve to properly condition and bias the output current monitor signal IMON for passage to the system control stage 26 of FIG. 1, circuit 100.

Figure 1D:
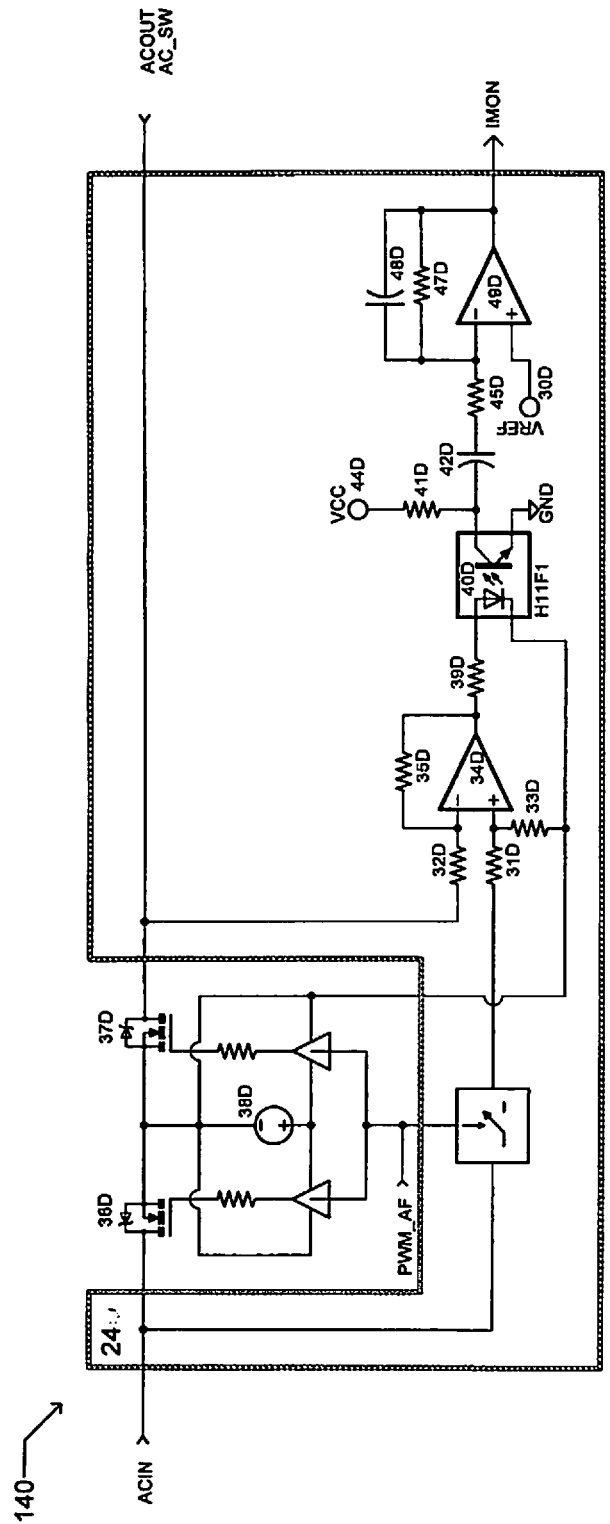
FIG. 1D is a third detailed diagram of an embodiment of a low cost current measurement isolation technique from FIG. 1.

Referring now to FIG. 1D, a detailed diagram 140 illustrates an embodiment of a third optional low cost technique for implementing the isolating current monitor stage 24 of FIG. 1, circuit 100. Though not limited thereto, circuit 24C contains one operational amplifier 34D configured in a differential amplifier topology via components 31D, 32D, 33D, and 35D wherein the output of operational amplifier 34D feeds the input of a linear optical isolator device 40D. The topology presented in circuit 24D provides the ability to increase the circuit sensitivity to voltage differential drops across transistors 36D and 37D through the use of operational amplifier 34D. Power for activating operational amplifier 34D can be supplied through floating supply source 38D, which is typically one of the isolated outputs REG_A from power supply stage 32 in FIG. 1, circuit 100. In this manner, power for operational amplifier 34D can be achieved without adding any additional stages to the high level block diagram presented in FIG. 1, circuit 100. Continuing with circuit 24D of FIG. 1D, operational amplifier circuit 49D and its respective biasing components 42D, 45D, 47D, and 48D serve to properly condition and bias the output of linear optical isolator 40D prior to passage of IMON to the system control stage 26 of FIG. 1, circuit 100.

Figure 1E:
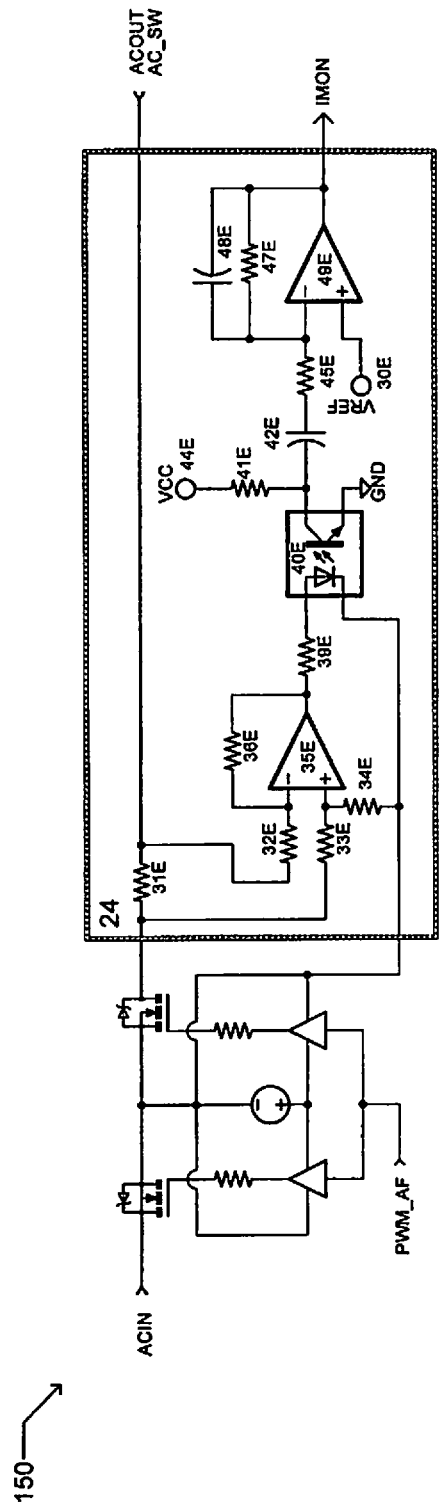
FIG. 1E is a fourth detailed diagram of an embodiment of a low cost current measurement isolation technique from FIG. 1.

Referring now to FIG. 1E, a detailed diagram 150 illustrates an embodiment of a fourth optional low cost technique for implementing the isolating current monitor stage 24 of FIG. 1, circuit 100. Circuit 24E is differentiated from the previous current monitoring circuits in that it does not use the conductive resistance of the bidirectional switching transistors as a fundamental current sense element, but instead makes use of a lumped current sense element 31E. The voltage drop across lumped current sense element 31E is detected by a differential amplifier comprised of operational amplifier 35E and its respective components 32E, 33E, 34E, and 36E. The output of operational amplifier 35E is then fed to the input of linear optical isolator 40E. Operational amplifier circuit 49E and its respective biasing components 42E, 45E, 47E, and 48E serve to properly condition and bias the output of linear optical isolator 40E prior to passage of IMON to the system control stage 26 of FIG. 1, circuit 100. Of interesting note is the circuit placement of lumped current sense element 31E, if sense element 31E is placed after bidirectional switch 47 of FIG. 1, circuit 100, and after the circuit node where the active clamp bidirectional switch 48 of FIG. 1, circuit 100, the lumped sense element 31E is always in circuit with load 62 of FIG. 1, circuit 100 thereby allowing continuous current sense during active switching of the series and clamping bidirectional switches.

Figure 1F:
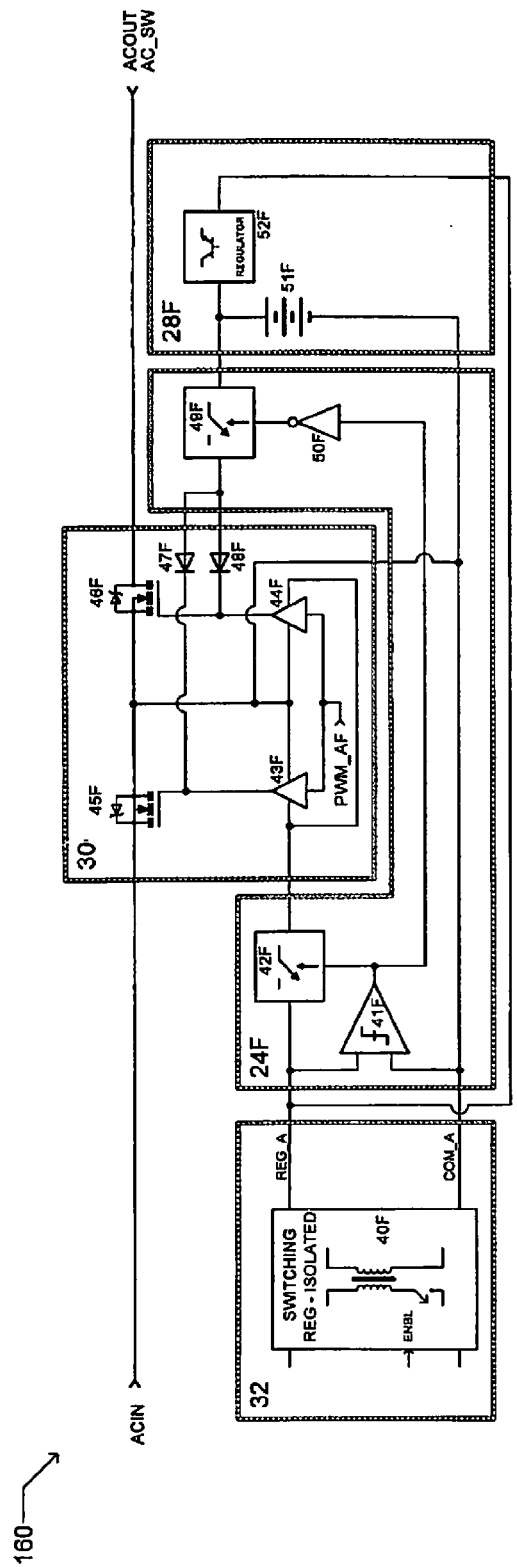
FIG. 1F is a first block diagram of an embodiment of a MOSFET hold-up technique from FIG. 1.

Referring now to FIG. 1F, circuit 160 illustrates an embodiment of a first technique within the present invention for implementing an enhancement MOSFET gate hold-up circuit used to hold-up the gate voltage of enhancement mode MOSFET devices 45F and 46F active during times when the main powering signal REG_A is not available or not enabled. Enhancement mode MOSFET or Insulated Gate Bipolar IGBT devices without the presence of adequate gate voltage do not provide electrical conduction across their respective high current terminals, such as the drain to source terminals for MOSFETs, or the collector to emitter terminals in the case of an IGBT. In other words, these devices are "normally off" and not conductive. As a result of this, previous techniques sought to use "normally-on" devices such as depletion MOSFETs; however, these devices raised system cost and did not provide the highest fidelity. Diagram 160, illustrates a technique for eliminating costly depletion devices and improving AC signal fidelity through an enhancement mode MOSFET gate hold-up circuit.

Continuing the discussion of FIG. 1F, block diagram 160 provides a more detailed illustration of an embodiment of the previously discussed electrically charged device 50, and ORing block 49 as seen within FIG. 1, circuit 100. For purposes of illustration and interfacing purposes, FIG. 1F block diagram 160 contains several previously discussed operational stages, such as the isolated power supply stage 32F and bidirectional switching stage 30F, which would be analogous to FIG. 1, circuit 100, stages 32 and 30 respectively. Though not limited thereto, FIG. 1F, diagram 160 provides a topology including an active ORing stage 24F and an electrically charged stage 28F with optional charging regulator 52F. Active ORing stage 24F is broadly comprised of one or more active DC switches 42F, 49F, a voltage detector 41F and 50F, and an optional pair of ORing diodes 47F and 48F. Circuit block 28F contains the electrically charged device and an optional charging regulator 52F. Broadly examining the operation of circuit 160, the active ORing circuit 24F is typically in one of two states: (1) normal gate drive mode, wherein PWM_AF is driven to transistors 45F and 46F through gate drivers 43F and 44F; or (2) hold-up gate mode, wherein gate drivers 43F and 44F are effectively disabled and electrically charged device 51F is connected to the MOSFET or IGBT gate pins to ensure conduction of said transistors 45F and 46F. In this manner, the active ORing stage 24F is responsible for determining what signals can drive the gates of transistors 45F and 46F and is also responsible for minimizing leakage current for electrically charged device 51F.

Though not limited thereto, electrically charged device 51F can be implemented with a battery or a super capacitor device and if so desired, can be re-charged through charge regulator 52F during times when REG_A is available. By minimizing leakage current consumption through the aforementioned active ORing technique and utilizing low-leakage gate controlled transistors 45F and 46F, the life span of the electrically charged device can be greatly extended. For example, using standard 3V Lithium coin cell batteries for electrically charged device 51F will provide MOSFET gate hold-up voltage for the rated shelf-life of the Lithium batteries, which is on the order of 10-20 years.

Referring again to FIG. 1F, active ORing stage 24F monitors the isolated powering signal REG_A through detection block 41F, which determines what mode to operate in (1) normal gate drive mode, or (2) hold-up gate mode. If detection block 41F detects adequate voltage potential on REG_A, it (1) enables the gate drivers 43F and 44F by closing DC switch 42F, and (2) disconnects electrically charged device 51F from the MOSFET 45F and 46F gates by opening DC switch 49F. Similarly, if detection block 41F detects inadequate voltage potential on REG_A, it (1) disables the gate drivers 43F and 44F by opening DC switch 42F, and (2) connects electrically charged device 51F to the MOSFET 45F and 46F gates by closing DC switch 49F. In this manner, the isolated power supply stage 32F can remain deactivated until high-frequency MOSFET switching is required, thereby greatly reducing the harmonic distortion on ACIN as discussed earlier in reference to FIG. 1. Additionally, by providing a solid and continuous gate voltage to enable transistors 45F and 46F of circuit 160, the harmonic distortion effects due to the passage of ACIN through transistors 45F and 46F is significantly reduced.

Figure 1G:
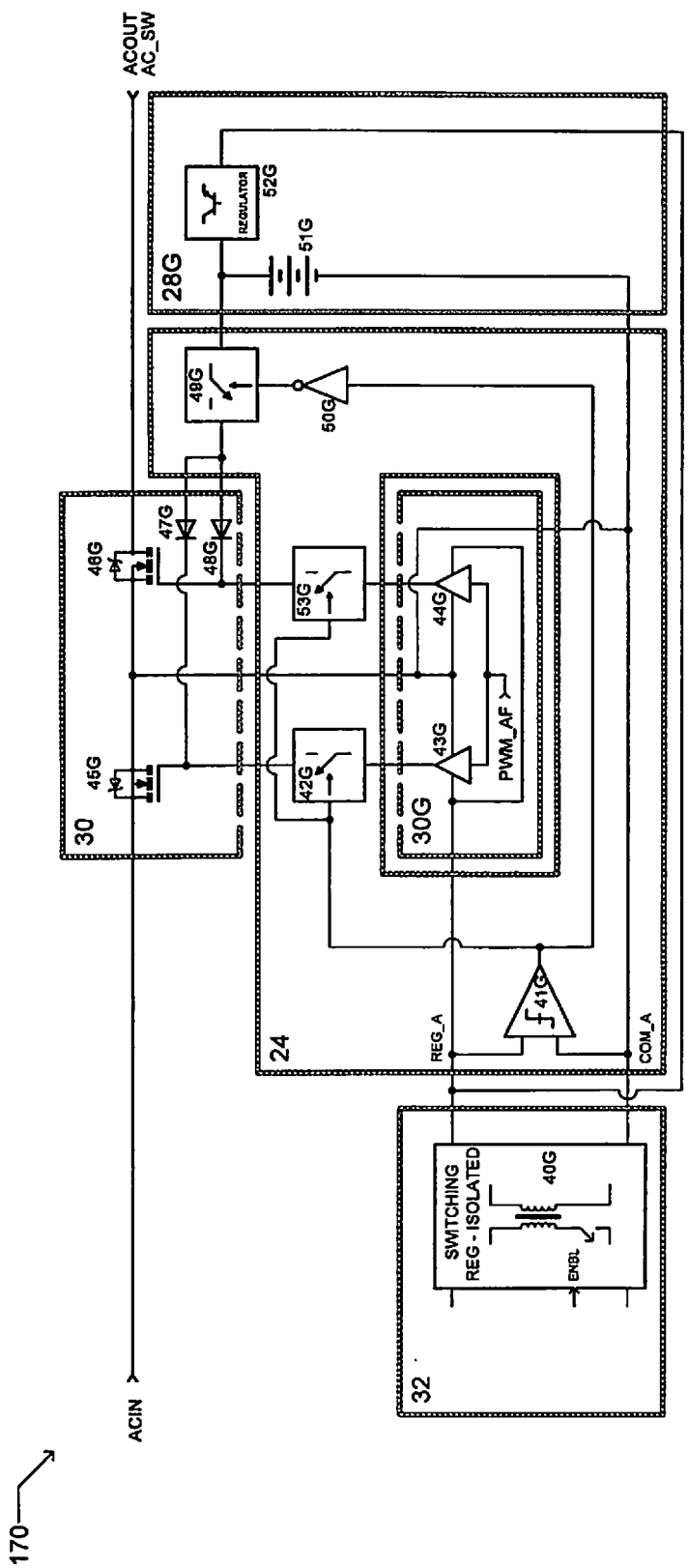
FIG. 1G is a second block diagram of an embodiment of a MOSFET hold-up technique from FIG. 1.

Referring to FIG. 1G, circuit 170 illustrates an embodiment of a second technique encompassed within the present invention for implementing an enhancement MOSFET gate hold-up circuit used to hold-up the gate voltage of enhancement mode MOSFET or IGBT devices 45F and 46F active during times when the main powering signal REG_A is not available or not enabled. Circuit 170 is presented to show an alternative implementation to that previously discussed wherein the active ORing stage 24G DC switch arrangement of 42G, 53G, 49G, is rearranged. The desired operation of circuit 170 is the same as the desired operation of circuit 160 in FIG. 1F; however, FIG. 1G, circuit 170 illustrates the active ORing stage 24G DC switches 42G and 53G configured to control the electrical connection between gate drivers 43G and 44G and their respective transistor gates 45G and 46G. During times when REG_A is unavailable or not enabled, DC switches 42G and 53G are opened, while DC switch 49G is closed to allow electrically charged device 51G to enable transistors 45G and 46G gates. Similarly, during times when REG_A is available, DC switches 42G and 53G are closed, while DC switch 49G is open, thereby allowing transistors 45G and 46G to be controlled by gate drivers 43G and 44G. Circuit 170 is intended to show an additional technique for implementing a long-life MOSFET gate hold-up circuit through the use of an electrically charged device and suitable active multiplexing electronics. It will be obvious to one skilled in the electrical arts that there are other implementation topologies to achieve similar results and should be considered well within the scope of the claims of this patent.

Figure 1H:
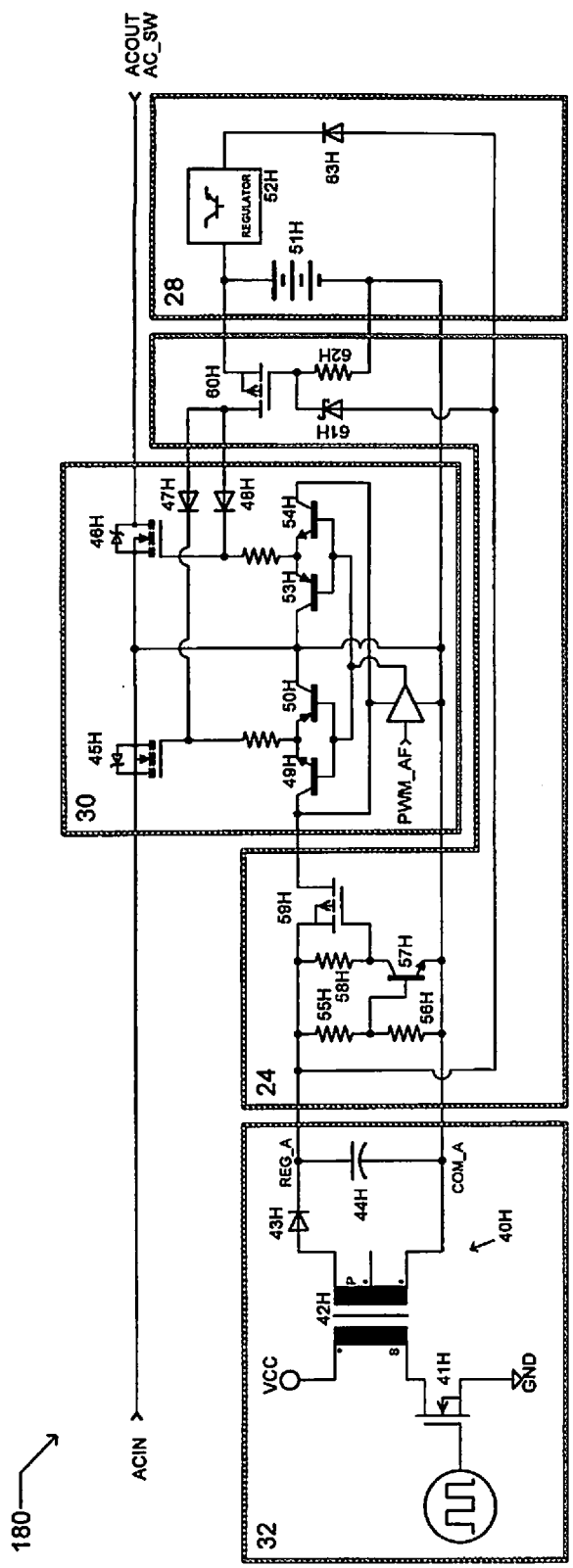
FIG. 1H is a detailed diagram of an embodiment of a MOSFET hold-up technique from FIG. 1.

Referring now to FIG. 1H, a detailed circuit 180 is presented in accordance with an embodiment of a preferred technique for implementing an enhancement MOSFET gate hold-up circuit used to hold-up the gate voltage of enhancement mode MOSFET or IGBT devices 45H and 46H active during times when the main powering signal REG_A is not available or not enabled. Examining the active ORing stage 24H, resistive elements 55H and 56H in conjunction with small signal transistor 57H serve to detect the presence of REG_A and drive small-signal MOSFET devices 59H and 60H. Resistors 55H and 56H form a traditional divider which feeds into the base of transistor 57H. When REG_A is greater than the voltage threshold determined by 55H, 56H and base turn-on of transistor 57H, P-channel transistor 59H is activated and P-channel transistor 60H is deactivated. Alternatively, when REG_A is less than the voltage threshold determined by 55H, 56H and base turn-on of transistor 57H, P-channel transistor 59H is disabled and P-channel transistor 60H is enabled through resistor 62H. This topology accomplishes the task of switching between normal gate drive mode and hold-up mode.

Figure 2:
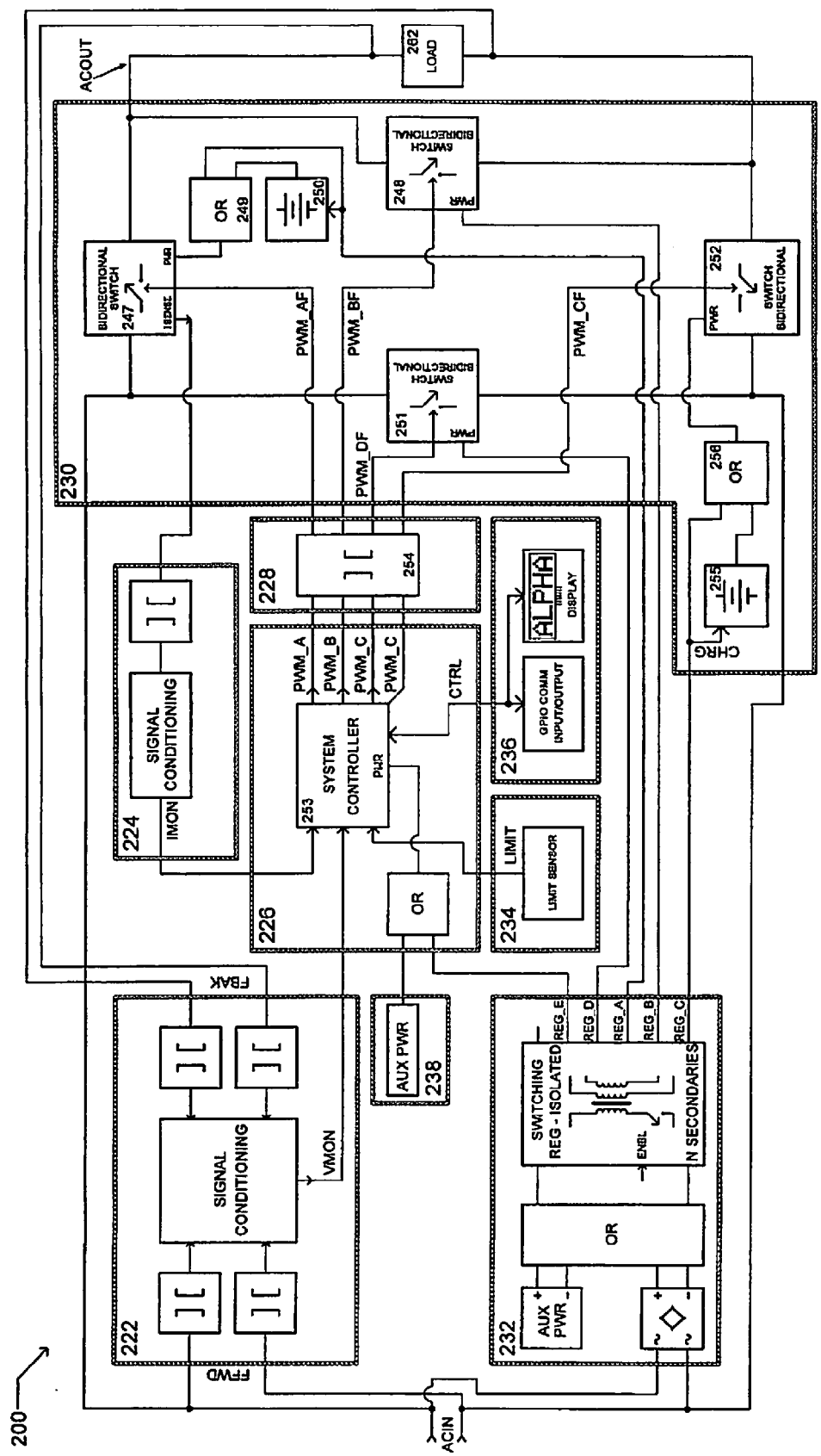
FIG. 2 is a block diagram of a second preferred embodiment of the present invention.

Referring now to FIG. 2, a preferred embodiment of a high performance AC protection and attenuation circuit 200 is shown to illustrate optional placements of additional bidirectional switches. Bidirectional switching stage 230 is drawn to broadly illustrate how one may add bidirectional switches within the present invention to realize certain performance advantages. Bidirectional switching stage 230 contains four distinct bidirectional switches connected in a topology that permits input and output active clamping as well as circuit interruption on both legs of the AC input signal ACIN. The present invention does not require all of these bidirectional switches 247, 248, 251, and 252, but they have been drawn to illustrate the scalability and functional capability within the present invention.

Looking at each bidirectional switch independently, one can see the versatility and scalable aspects of the present invention. Starting with bidirectional switch 248, this said switch is operable to provide active clamping on the load during moments when the series bidirectional switch 247 or 252 have been deactivated, or opened. Such active load clamping is ideal when load 262 is significantly inductive in nature, such as wire-wound woofer voice coil, thereby benefiting from an available current path during inductive discharge or free-wheeling. With loads that are not significantly inductive it may be desirable to eliminate bidirectional switch 248. Similarly, bidirectional switch 251 is operable to provide active clamping on the input during moments when the series bidirectional switch 247 or 252 have been deactivated, or opened. Such active input clamping is ideal when the input source creating ACIN is significantly inductive in nature, such as a transformer, thereby benefiting from an available current path during inductive discharge or free-wheeling. With input sources that are not significantly inductive it may be desirable to eliminate bidirectional switch 251.

Examining the series bidirectional switches 247 and 252, one will realize that in many circumstances only a single series bidirectional switch is required 247 or 252. However, there are cases where interrupting both legs of the AC input signal ACIN can be desirable, wherein the present invention can accommodate this requirement. Though not limited thereto, most audio related protection networks have only required a single series bidirectional switch 247 and for inductive loudspeakers, the addition of a single load clamping bidirectional switch 248. It should also be noted that the derivation of the isolated pulse width modulation signals PWM_AF, PWM_BF, PWM_CF, and PWM_DF does not have to solely reside with the system controller 253. There are cases where one PWM signal from system controller 253 can be used to derive the necessary PWM signals for driving the implemented bidirectional switches. For example, PWM_AF and PWM_CF are typically driven with the same timing relationships and may even be duplicates of one another. Similarly, PWM_BF and PWM_DF are typically driven with the same timing relationships and may be duplicates of one another as well. With this in mind, it will be obvious to one skilled in the electrical arts that the derivation of said PWM signals may be done from a single signal or a smaller set of signals as deemed necessary.

Continuing the discussion of FIG. 2, bidirectional switching stage 230 is draw to illustrate the option of a second electrically charged device 255 and ORing block 256. This is desirable when incorporating series bidirectional switch 252 and one wishes to hold bidirectional switch 252 in a "normally-on" state, even during times when the isolated power supply signal REG_C is unavailable or disabled.

Figure 3:
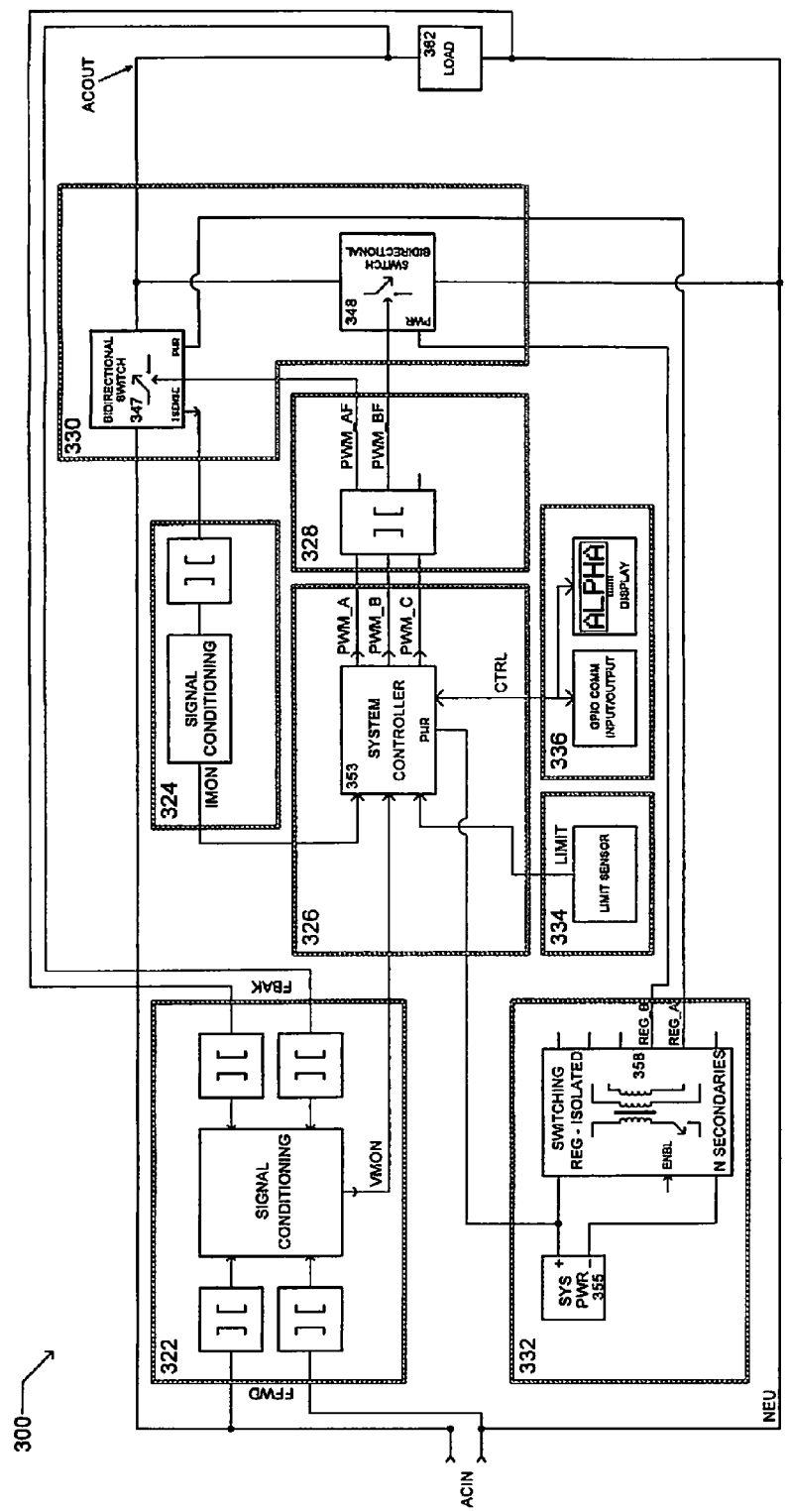
FIG. 3 is a block diagram of a third preferred embodiment of the present invention.

Referring to FIG. 3, an embodiment of a high performance AC protection and attenuation circuit 300 is shown. The protection circuit 300 broadly includes the previously discussed circuit stages: optional isolating current monitor stage 324, optional isolating voltage monitor stage 322, system control stage 326, bidirectional switching stage 330, pulse isolation stage 328, isolated power supply stage 432, optional limit sense stage 334, and optional interface stage 336. However, circuit 300 is drawn to illustrate a simplified system powering topology that allows the removal of auxiliary voltage sources, electrically charged devices, and ORing blocks. Though not limited thereto, circuit 300 illustrates a system powering topology that would be typical in applications that have readily available power such as instances wherein the invention has access to stable DC power supplies, batteries, or AC mains power. In these applications, it may be desirable to derive all operational power for the circuit stages from the readily available power source indicated by system power block 355 in circuit 300.

System power block 355 is connected in a manner to provide continuous power to the system controller 353 the isolated regulator 358 and all subsequent devices as used in optional interface stage 336, optional limit sense stage 334, optional isolating voltage monitor stage 322, and isolating current monitor stage 324. By ensuring that system control stage 326 and bidirectional switching stage 330 are powered from a stable system power source 355, circuit 300 allows (1) rapid response to VMON and IMON overage indicators, (2) ensures stable gate hold-up on bidirectional switch 347 thereby greatly reducing distortion and eliminating the need for depletion MOSFET devices, and (3) allows uninterrupted data flow to outside devices vial interface stage 336 and continuous monitoring of CTRL, IMON, VMON, and LIMIT. The topology of circuit 300 is ideal for instances wherein the present invention is used within a stand-alone chassis that can provide stable AC or DC power.

Figure 4:
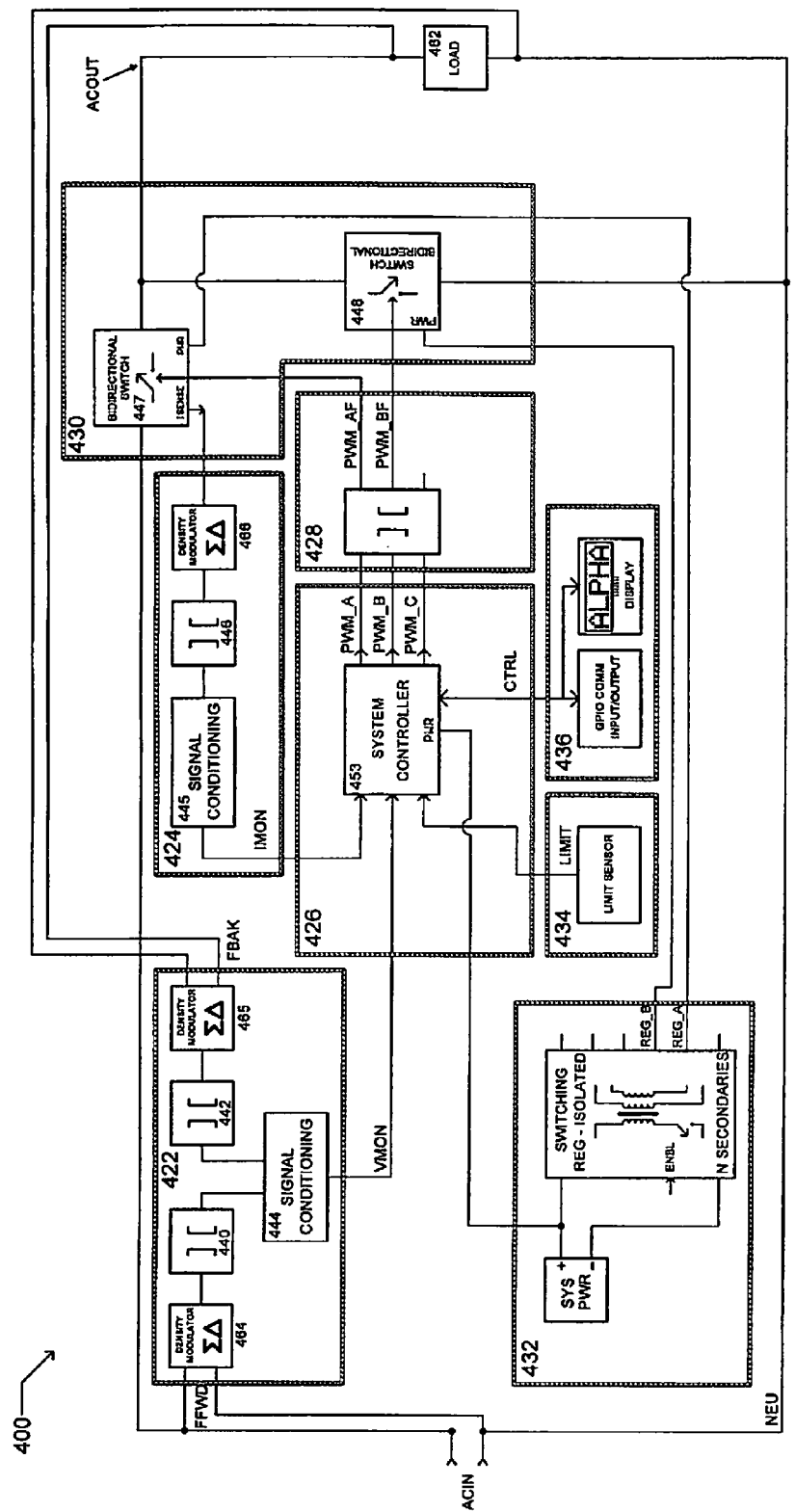
FIG. 4 is a block diagram of a fourth preferred embodiment of the present invention.

Referring to FIG. 4, an embodiment of a high performance, high resolution AC protection and attenuation circuit 400 is shown. The protection circuit 400 broadly includes the previously discussed circuit stages: optional isolating current monitor stage 424, optional isolating voltage monitor stage 422, system control stage 426, bidirectional switching stage 430, pulse isolation stage 428, isolated power supply stage 432, optional limit sense stage 434, and optional interface stage 436. However, circuit 400 is drawn to illustrate a topology that provides increased resolution for isolated current monitoring signal IMON and isolated voltage monitoring signal VMON through the use of high resolution density modulation, such as, but limited to, delta modulation, sigma-delta modulation, PWM modulation, etc. This resolution improvement increases the usable dynamic range of IMON and VMON to allow more precise voltage and current measurements, thereby by yielding more accurate power and impedance calculations.

Isolating voltage monitor stage 422 of circuit 400 is drawn to broadly include one or more density modulators 464, 465; one ore more digital isolation devices 440, 442; and optional signal conditioner 444. Isolating voltage monitor stage 422 is drawn to illustrate the ability to monitor either the AC input signal ACIN in a feed forward FFWD architecture, or to monitor the AC output signal ACOUT in a feed back FBAK architecture. Though not limited thereto, the present invention typically utilizes one input to the isolating voltage monitor stage 422; either (1) FFWD, or (2) FBAK. Isolating voltage monitor stage 422 is operable to accept one or more voltage inputs FFWD or FBAK and derive therefrom a high resolution isolated output signal VMON proportional to the input voltage signal FFWD or FBAK. This can be accomplished within the present invention by utilizing one or more density modulators 464, 465. Such modulators typically create a single bit-stream that varies one or more characteristics of the output pulses such as pulse width or pulse frequency. A common density modulator can be constructed using sigma-delta modulation, delta modulation, or PWM modulation, wherein the output of said modulator 464 or 465 is fed into a high speed digital isolator 440 or 442 for passage to optional signal conditioner 444 or directly to system controller 453. Optional signal conditioner 444, if so desired, can convert this pulse modulated bit-stream as received from isolator 440 or 442 back into an analog continuous time waveform through low pass filtering. Alternatively, signal conditioner 444 may be used to provide adequate DC voltage biasing to the pulse modulated bit-stream received from isolator 440 or 442, thereby preparing the signal VMON for passage to system controller 453.

Isolating current monitor stage 424 of circuit 400 is drawn to broadly include one or more density modulators 466; one or more digital isolation devices 446; and optional signal conditioner 445. Though not limited to, isolating current monitor stage 424 is drawn to illustrate the ability to monitor the current flow through series bidirectional switch 447. Isolating current monitor stage 424 is operable to accept one or more inputs and derive therefrom a high resolution isolated output signal IMON proportional to the current flow through the monitored device, such as bidirectional switch 447. This can be accomplished within the present invention by utilizing one or more density modulators 466 prior to digital isolation. As previously discussed, such modulators typically create a single bit-stream that varies one or more characteristics of the output pulses such as pulse width or pulse frequency. A common density modulator can be constructed using sigma-delta modulation, delta modulation, or PWM modulation, wherein the output of said modulator 466 is fed into a high speed digital isolator 446 for passage to optional signal conditioner 445 or directly to system controller 453. Optional signal conditioner 445, if so desired, can convert this pulse modulated bit-stream as received from isolator 446 back into an analog continuous time waveform through low pass filtering. Alternatively, signal conditioner 445 may be used to provide adequate DC voltage biasing to the pulse modulated bit-stream received from isolator 446, thereby preparing the signal IMON for passage to system controller 453.

Figure 4A:
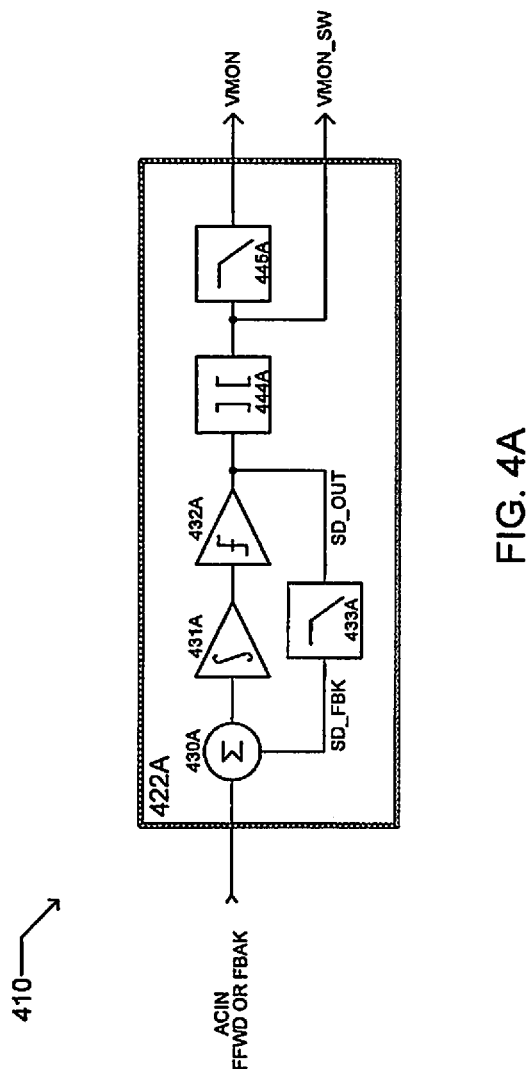
FIG. 4A is a block diagram of an embodiment of a high resolution voltage isolation technique from FIG. 4.

Referring now to FIG. 4A, a simplified block diagram 410 is provided to illustrate one possible implementation of the isolating voltage monitor stage 422 as seen in FIG. 4. In circuit 410, a simple sigma-delta modulator is created through summation block 430A, integrator 431A, 1-bit quantizer 432A, and a low pass filter 433A. Summation block 430A serves to sum the input signal ACIN, FFWD, or FBAK with the fed back signal SD_FBK. Following summation, the output of summation block 430A is fed into integrator 431A, whose output is subsequently fed into a 1-bit quantizer 432A. Quantizer 432A creates a bit-stream whose characteristics modulate with respect to the input signal ACIN, FFWD, or FBAK. Of critical importance is the low pass filter 433A within the feedback loop, which serves to effectively convert the high frequency pulse modulated output of quantizer 432A SD_OUT back into an analog signal SD_FBK for summation with the input. The effect of this sigma-delta topology is well understood within the electrical arts as providing a shaping effect to the quantization noise wherein the quantization noise is shifted up in frequency thereby providing a higher dynamic range within the frequency band of interest. The output of the aforementioned sigma-delta density modulator SD_OUT is fed into a high-speed digital isolation device 444A. Because SD_OUT is a high frequency pulse modulated bit-stream, it is typical to select a digital isolator 444A with adequate speed and minimal pulse width distortion. Though not limited to, high speed optical isolators, pulse transformers, capacitive isolators, or integrated digital isolators are often used for isolator 444A. The pulse output of isolator 444A can be passed through a conditioning low pass filter 445A to create VMON or can be routed directly downstream to provide an isolated, pulse modulated bit-stream VMON_SW for use within the system control stage 426 of FIG. 4 circuit 400.

Figure 4B:
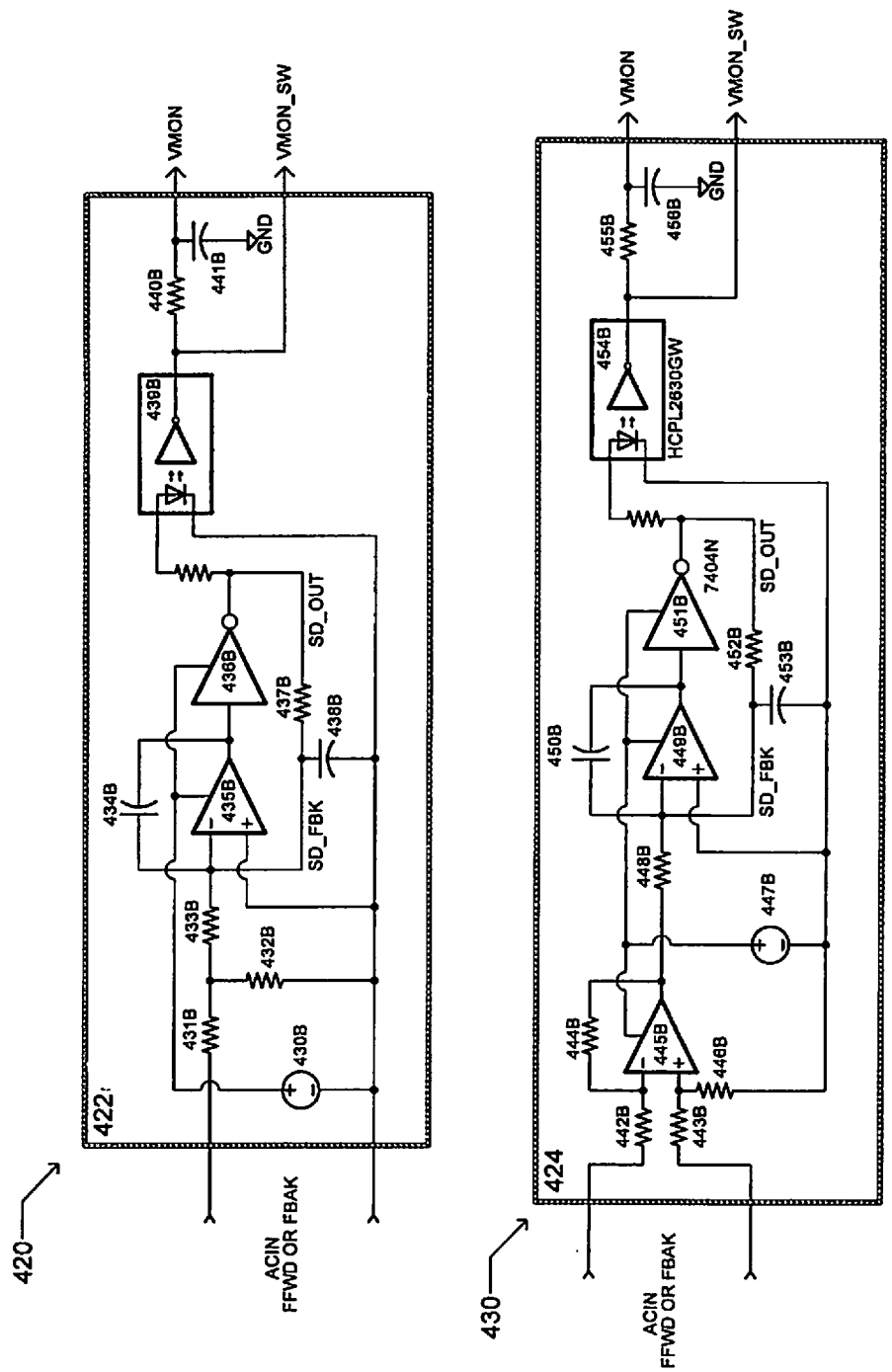
FIG. 4B is a detailed diagram of an embodiment of a high resolution voltage isolation technique from FIG. 4.

Referring now to FIG. 4B, a detailed diagram including circuits 420 and 430 has been provided to illustrate two possible embodiments for implementation of the isolating voltage monitor stage 422 as seen in FIG. 4. Circuit 420, stage 422B, of FIG. 4B illustrates a detailed density modulator, isolation device, and output low pass filter. The density modulator is broadly constructed as a sigma-delta modulator consisting of, but not limited to, (1) operational amplifier 435B configured to sum and integrate input and feedback signals SD_FBK and FFWD, FBAK; (2) quantizing digital inverter 436B; and (3) low pass feedback filter comprised of resistor 437B and capacitor 438B. The output of the density modulator SD_OUT is realized at the output of quantizing digital inverter 436B and is passed to high-speed digital optical isolator 439B.

Although a variety of different low pass filters could be used within the sigma-delta feedback path, a simple resistive capacitive low-pass is created with resistor 437B and capacitor 438B. Similarly, the output of the high-speed digital isolator 439B can be low pass filtered to create a continuous time signal VMON using a similar resistive capacitive filter constructed with devices 440B and 441B. Alternatively, a non-filtered version VMON_SW of the isolated, pulse modulated, sigma-delta output SD_OUT can be passed directly to the system control stage (stage 426 in FIG. 4) if desired. Power source 430B for density modulator components 435B and 436B can be realized through a low-power, isolated output from power supply stage 432 of FIG. 4 circuit 400, or through a boot-strapped supply developed from REG_A output from power supply stage 432 of FIG. 4 circuit 400. A said bootstrap supply could be implemented using a single diode and a capacitor in the following means: (1) said capacitor has one leg connected to the ACIN, FFWD, or FBAK signal, (2) said capacitor has the other leg connected to the cathode of a high voltage switching diode; (3) high voltage switching diode has anode leg connected to REG_A in FIG. 4, circuit 400. This simple bootstrap supply could easily power density modulator components 435B and 436B for operation.

Continuing the discussion of FIG. 4B and focusing on circuit 430, stage 424B, a second implementation option is presented for density modulated isolating voltage monitor stage 422 as seen in FIG. 4. Circuit 430, stage 42$B, of FIG. 4B illustrates a detailed density modulator, isolation device, and output low pass filter. The density modulator is broadly constructed as a sigma-delta modulator consisting of, but not limited to, (1) differential input amplifier 445B, (2) operational amplifier 449B configured to sum and integrate; (2) quantizing digital inverter 451B; and (3) low pass feedback filter comprised of resistor 452B and capacitor 453B. Circuit 430 is different from circuit 420 in that a differential input amplifier has been added 445B to provide a differential voltage input prior to density modulation. All subsequent components in circuit 430 are used with similar function as those seen in circuit 420 and previously discussed.

Figure 4C:
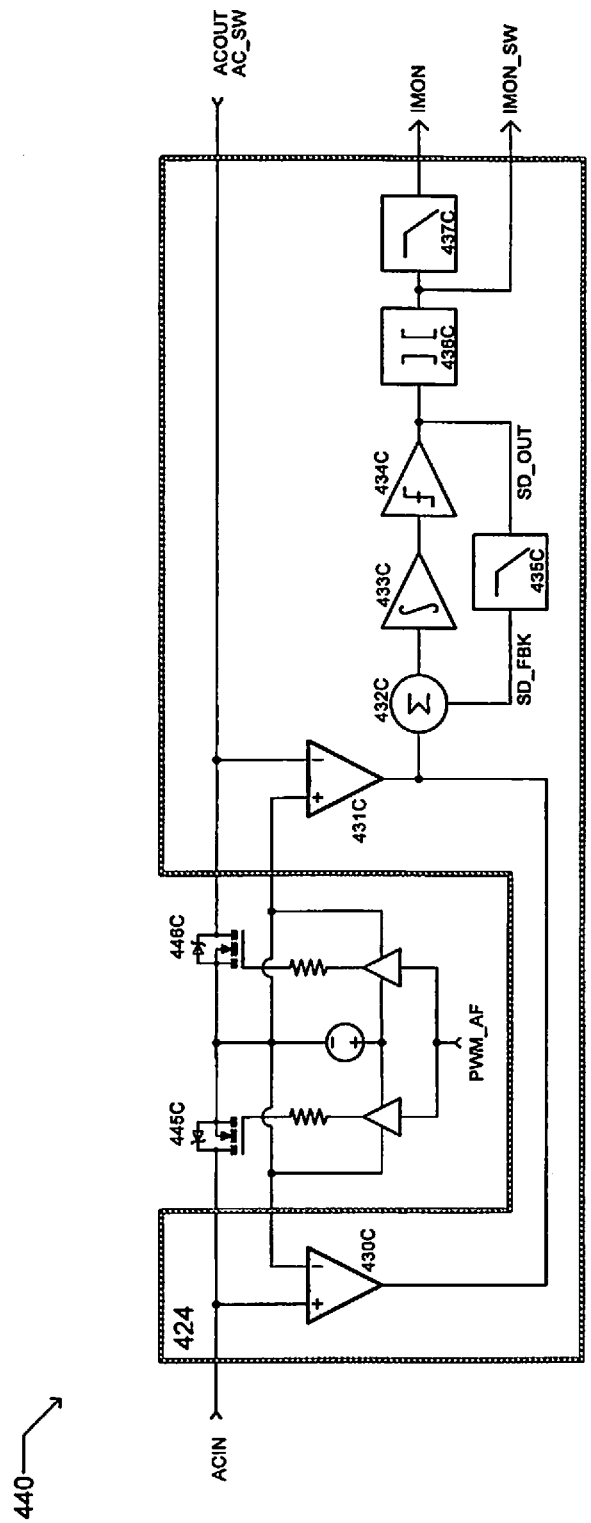
FIG. 4C is a block diagram of an embodiment of a high resolution current measurement isolation technique from FIG. 4.

Referring to FIG. 4C, a simplified block diagram 440 is provided to illustrate a possible implementation of the isolating current monitor stage 424 as seen in FIG. 4. In circuit 440, a simple sigma-delta modulator is created through summation block 432C, integrator 433C, 1-bit quantizer 434C, and a low pass filter 435C. Input to the density modulator summation block 432C is developed by optional buffers 430C and 431C connected across at least one of the two series transistors 445C or 446C used to create a bidirectional switch. Circuit 440 is drawn to illustrate voltage detection across both transistors 445C and 446C; however, it will be obvious to one skilled in the arts that either transistor 445C or 446C could be used as a current sensing resistance to develop an input voltage signal for density modulator summation block 432C. Following summation, the output of summation block 432C is fed into integrator 433C, whose output is subsequently fed into a 1-bit quantizer 434C. Quantizer 434C creates a bit-stream whose characteristics modulate proportionally with respect to the current flowing through transistors 445C and 446C. Of critical importance is the low pass filter 435C within the feed back loop, which serves to effectively convert the high frequency pulse modulated output of quantizer 434C SD_OUT back into an analog signal SD_FBK for summation with the input.

The effect of this sigma-delta topology has been previously discussed in respect to the high resolution isolating voltage monitor implementation options. The output of the aforementioned sigma-delta density modulator SD_OUT is fed into a high-speed digital isolation device 436C. Because SD_OUT is a high frequency pulse modulated bit-stream, it is typical to select a digital isolator 436C with adequate speed and minimal pulse width distortion. Though not limited to, high speed optical isolators, pulse transformers, capacitive isolators, or integrated digital isolators are often used for isolator 436C. The pulse output of isolator 436C can be passed through a conditioning low pass filter 437C to create IMON or can be routed directly downstream to provide an isolated, pulse modulated bit-stream IMON_SW for use within the system control stage 426 of FIG. 4 circuit 400.

Figure 4D:
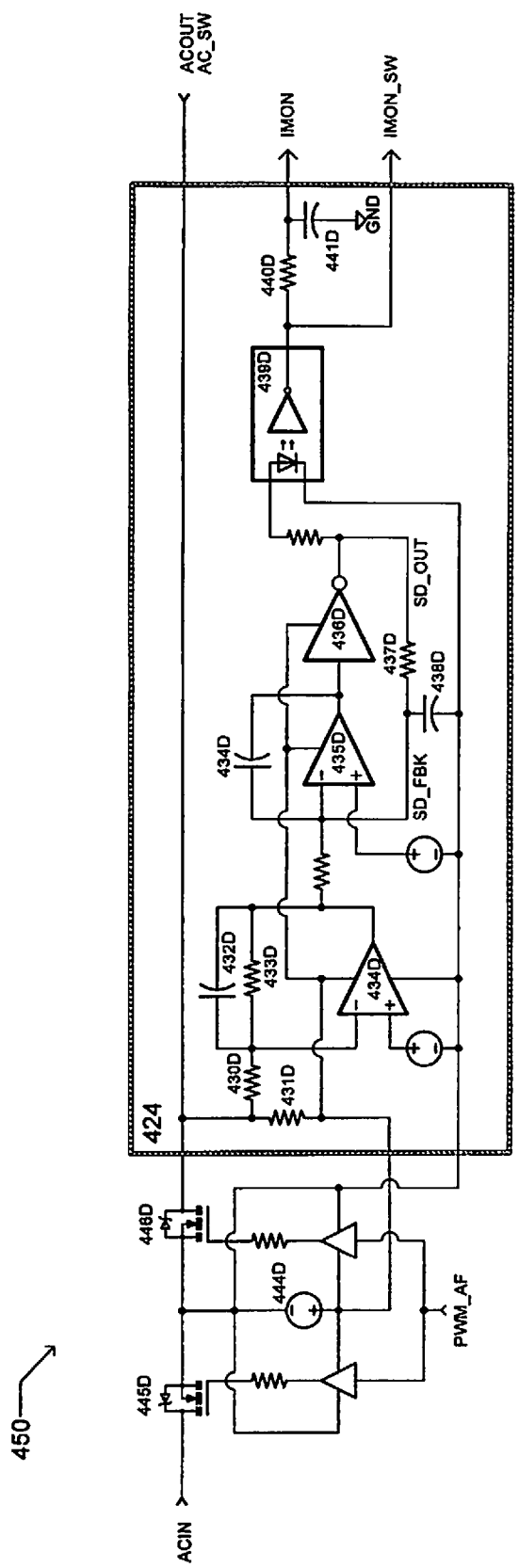
FIG. 4D is a detailed diagram of an embodiment of a high resolution current measurement isolation technique from FIG. 4.

Referring to FIG. 4D, a detailed diagram 450 has been provided to illustrate a possible embodiment for implementation of the isolating current monitor stage 424 as seen in FIG. 4. Circuit 450, stage 424D, of FIG. 4D broadly illustrates a buffer amplifier, detailed density modulator, isolation device, and output low pass filter. Though not limited thereto, an active buffer is drawn leading the input to the density modulator. Operational amplifier 434D and its respective biasing components 430D, 431D, 432D, and 433D, serve to bias and buffer the voltage drop detected across transistor 446D as a result of current flowing through said transistor. The output of operational amplifier buffer 434D is fed into the summation node of the density modulator comprised of, but not limited to, (1) operational amplifier 435D configured to sum and integrate input and modulator feedback signals; (2) quantizing digital inverter 436D; and (3) low pass feedback filter comprised of resistor 437D and capacitor 438D. Density modulator output SD_OUT is then fed to a high-speed digital isolator for electrical isolated transmission to the optional signal conditioning low pass filter 440D, 441D. The pulse output of isolator 439D can be passed through a conditioning low pass filter 440D, 441D to create IMON or can be routed directly downstream to provide an isolated, pulse modulated bit-stream IMON_SW for use within the system control stage 426 of FIG. 4 circuit 400.

Figure 5:
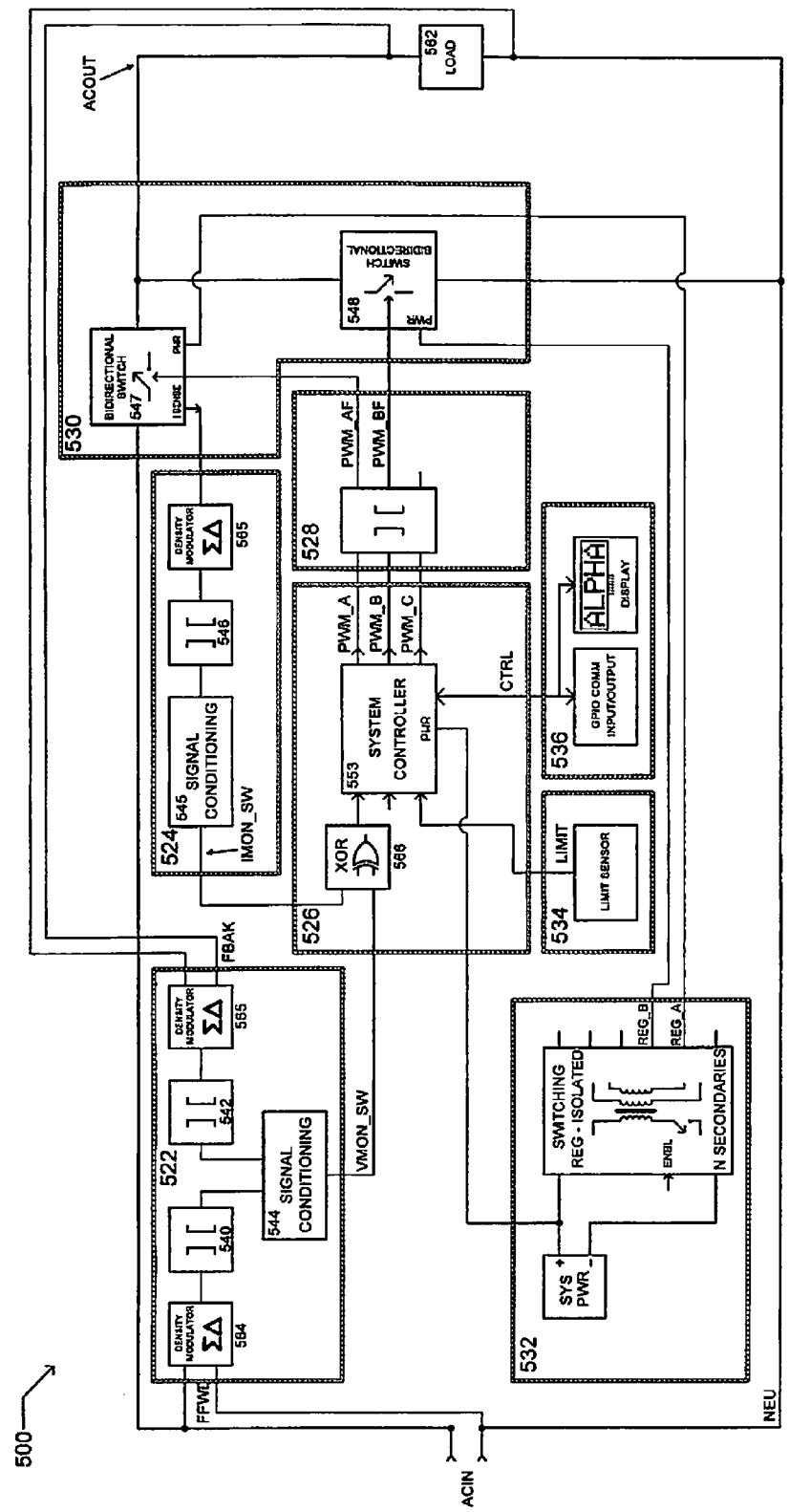
FIG. 5 is a block diagram of a fifth preferred embodiment of the present invention.

Referring now to FIG. 5, an embodiment of a high performance, high resolution AC protection and attenuation circuit 500 is shown. The protection circuit 500 broadly includes the previously discussed circuit stages: optional isolating current monitor stage 524, optional isolating voltage monitor stage 522, system control stage 526, bidirectional switching stage 530, pulse isolation stage 528, isolated power supply stage 532, optional limit sense stage 534, and optional interface stage 536. However, circuit 500 is drawn to illustrate a low cost technique to derive real-time power measurements and impedance measurements by simple combinatorial logic of two density modulated pulse streams IMON_SW and VMON_SW. This technique is ideal for removing the burden on system controller 553 to perform a complex multiplication. In other words, system controller 553 does not have to continuously multiply or divide the two input signals VMON and IMON to determine the load impedance or load current flow, thereby allowing a smaller, low-cost microcontroller to be selected for system controller 553. This combinatorial solution can be realized by passing pulse density modulated outputs IMON_SW and VMON_SW directly to the system control stage 526, wherein a simple exclusive OR operation 566 can be used to effectively create a pulse width modulated signal proportional to the actual power delivered to load 562. An optional low pass filter can be included after exclusive OR 566 and before system controller 553 as desired.

Figure 6:
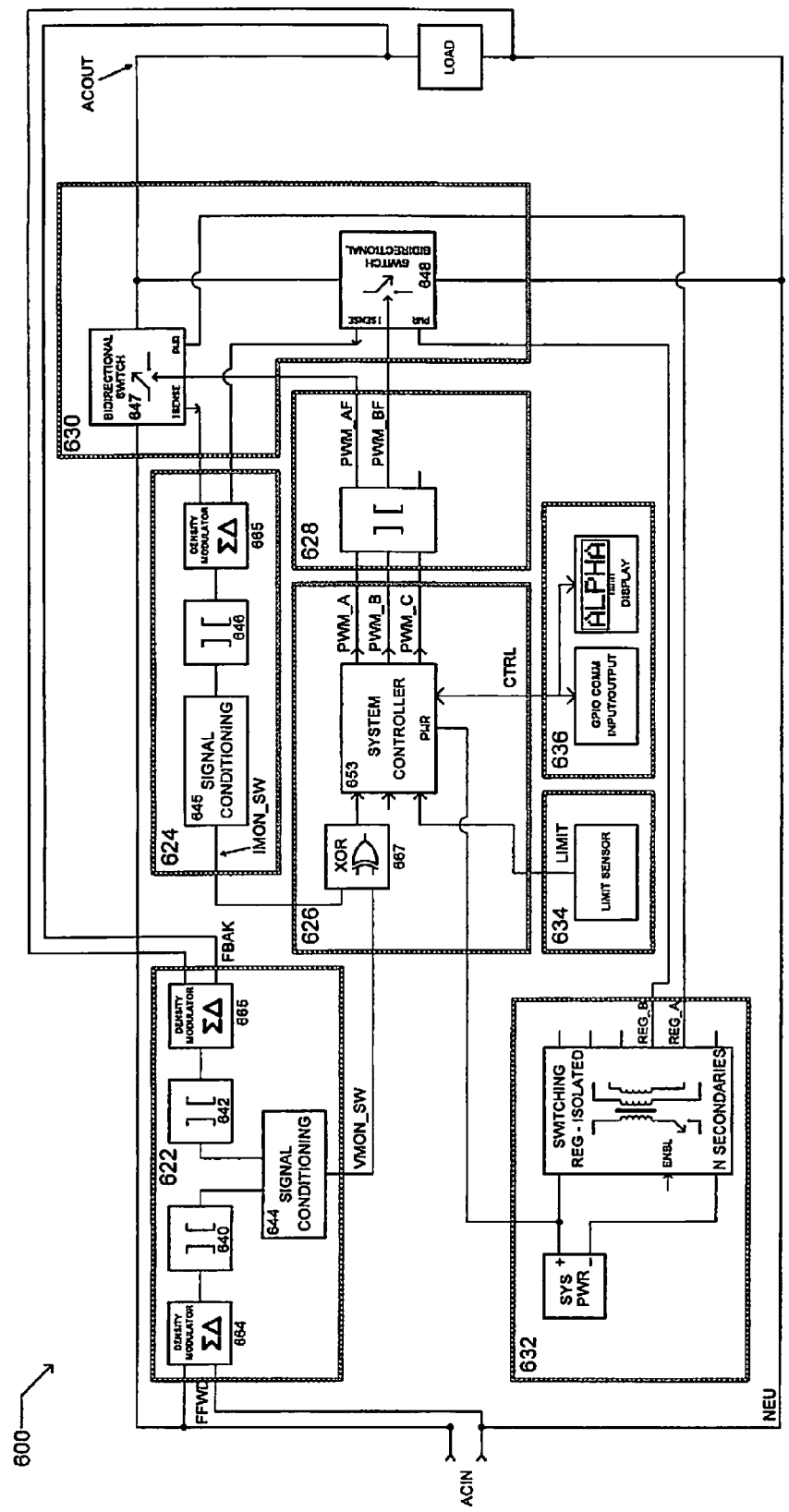
FIG. 6 is a block diagram of a sixth preferred embodiment of the present invention.

Referring now to FIG. 6, an embodiment of a high performance, high resolution AC protection and attenuation circuit 600 is shown. The protection circuit 600 broadly includes the previously discussed circuit stages: optional isolating current monitor stage 624, optional isolating voltage monitor stage 622, system control stage 626, bidirectional switching stage 630, pulse isolation stage 628, isolated power supply stage 632, optional limit sense stage 634, and optional interface stage 636. However, circuit 600 is drawn to illustrate an optional two input isolating current monitor stage 665, wherein bidirectional switches 647 and 648 both contain isolated current monitor circuits. In this manner, the present invention can monitor series current flow, as well as active clamp current flow. This can be critical for implementations where a user may accidentally reverse the input connection and the output connection, or any other application wherein quantifying the clamping current is desirable.

Figure 7:
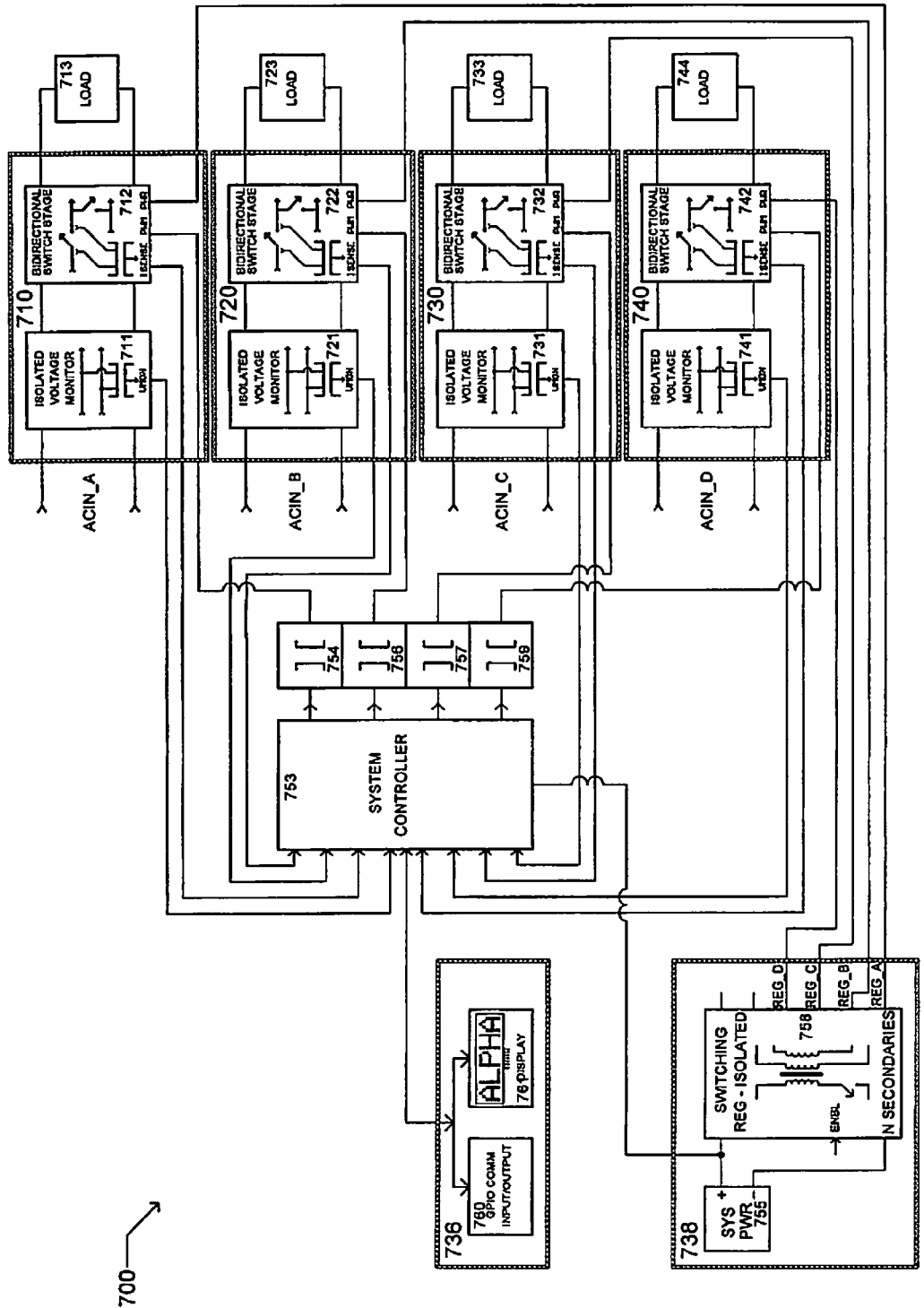
FIG. 7 is a block diagram of a seventh preferred embodiment of the present invention.

Referring now to FIG. 7, an embodiment of a multi-channel high performance AC protection and attenuation circuit 700 is shown. The protection circuit 700 broadly includes the previously discussed circuit stages; however, circuit 700 is drawn to illustrate a multi-channel AC protection and attenuation circuit utilizing one system controller 753 to monitor and control a plurality of AC inputs ACIN_A, ACIN_B, ACIN_C, ACIN_D; a plurality of AC loads 713, 723, 733, 744; a plurality of isolated voltage monitor stages 711, 721, 731, 741; and a plurality of independent bidirectional switching stages 712, 722, 732, 742 with isolated current monitoring capability. Each respective AC protection and attenuation channel 710, 720, 730, and 740 are independently drawn in circuit 700 for ease of illustration. Though not limited thereto, a single isolated power supply stage 738 can be constructed to independently power AC protection and attenuation channels 710, 720, 730, and 740.

It is typical for the isolated power supply stage 738 to derive its input from a stable system power source 755 and utilize an isolated switching regulator 758 to create as many electrically floating power signals as needed. Circuit 700 illustrates a four channel architecture, therefore power supply stage 738 is drawn developing REG_A, REG_B, REG_C, and REG_D for the respective channels. Due to the advantages of employing the isolation techniques and topologies contained within this invention and previously discussed with reference to preceding embodiments, a single system controller 753 can seamlessly communicate with outside digital devices through interface stage 736, while continuously monitoring and controlling multiple channels of AC protection and attenuation. This topology is ideal for multi-channel applications such as home audio systems, car audio systems, and pro audio systems that typically use multiple loudspeakers, loads 713, 723, 733, 744, and would greatly benefit from a low-cost, low distortion, high performance AC monitoring, protection, and attenuation system.

Of special note is the ability of the present invention to continuously monitor and report AC power delivery and load impedance through isolated voltage and current monitoring. This allows the present invention to perform several real-time measurements that can benefit an audio loudspeaker protection system. For example, it is often beneficial to monitor the impedance of a loudspeaker to watch for abnormal changes in the nominal impedance that may signify the onset of load damage. Also, by monitoring voltage and current through isolated mechanisms and providing low cost ways to calculate power and load impedance, the system controller can easily monitor loudspeaker impedance over frequency and thereby have insight into the resonance frequencies of the loudspeaker load. Providing the system controller the ability to measure loudspeaker resonance can allow automated determination of enclosure type, sealed or ported, and can be used to determine low frequency sensitivity regions wherein the system controller should increase its sensitivity to protect against low frequency over excursion.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of protecting AC loads, the method comprising:
monitoring one or more characteristics of an AC signal on an electrical line in communication with the AC load, wherein the monitoring is performed by a controller; and
attenuating the AC signal using the pulse width modulated signal from the controller by generating a pulse width modulated signal based on the one or more characteristics of the AC signal to control a switching stage connected to the electrical line carrying the AC signal and controlled by the controller;
wherein the controller is isolated from at least the switching stage and a signal conditioning stage by one or more electrical isolation stages, the signal conditioning stage providing a signal indicative of the one or more characteristics of the AC signal, and wherein the controller is electrically isolated from the AC signal such that the controller electrically floats relative to the AC signal.

2. The method of claim 1 wherein the one or more characteristics of the AC signal comprises an electrically isolated voltage monitoring signal.

3. The method of claim 1 wherein the one or more characteristics of the AC signal comprises an electrically isolated current monitoring signal.

4. The method of claim 1 further comprising monitoring the power delivered to the load, wherein the one or more characteristics of the AC signal comprises both an electrically isolated voltage monitoring signal and an electrically isolated current monitoring signal.

5. The method of claim 1 further comprising deriving the impedance of the load, wherein the at least one characteristic of the AC signal comprises both an electrically isolated voltage monitoring signal and an electrically isolated current monitoring signal.

6. The method of claim 1 wherein the switching stage includes a bidirectional switch.

7. The method of claim 2 wherein electrical isolation of voltage monitoring signals is achieved through one or more optical isolating devices.

8. The method of claim 2 wherein electrical isolation of voltage monitoring signals is achieved through one or more magnetic isolating devices.

9. The method of claim 3 further comprising deriving the current monitoring signals by monitoring the voltage potential developed across the conductive resistance of one or more bidirectional switches and passing this voltage potential through one or more electrically isolating devices.

10. The method of claim 3 wherein electrical isolation of current monitoring signals is achieved through one or more optical isolating devices.

11. The method of claim 3 wherein electrical isolation of current monitoring signals is achieved through one or more magnetic isolating devices.

12. The method of claim 2 further comprising digitizing the voltage monitoring signal prior to electrical isolation through the use of a density modulator.

13. The method of claim 3 further comprising digitizing the current monitoring signal prior to electrical isolation through the use of a density modulator.

14. The method of claim 6 wherein the bidirectional switch includes field effect transistor devices.

15. The method of claim 6 wherein one or more bidirectional switches is kept in a normally-conductive state through the use of an electrically charged device.

16. A method for protecting multiple AC loads, the circuit comprising:
monitoring one or more characteristics of a plurality of AC signals using a controller and a plurality of signal conditioning stages connected to the controller and each signal conditioning state providing a signal indicative of the one or more characteristics of the associated AC signal, wherein each AC signal is on an electrical line in communication with an associated AC load; and
generating a pulse width modulated signal for each of the AC signals based on the one or more characteristics of the plurality of AC signals using a plurality of switching stages, each of the plurality of switching stages connected to the electrical line carrying the associated AC signal and controlled by the controller, wherein each of the switching stages attenuates the associated AC signal using the pulse width modulated signal from the controller;
isolating the controller from at least the plurality of switching stages and the plurality of signal conditioning stages using one or more electrical isolation stages, wherein the controller is electrically isolated from the plurality of AC signals such that the controller electrically floats relative to the plurality of AC signals.

17. The method of claim 16 wherein the one or more characteristics of each of the plurality of AC signals comprises an electrically isolated voltage monitoring signal.

18. The method of claim 16 wherein the one or more characteristics of each of the plurality of AC signals comprises an electrically isolated current monitoring signal.

19. The method of claim 16 further comprising monitoring the power delivered to the load and deriving the impedance of the load for each of the plurality of AC signals using both an electrically isolated voltage monitoring signal and an electrically isolated current monitoring signal.

20. The method of claim 16 wherein each of the switching stages includes a bidirectional switch.

* * * * *